(12) United States Patent
Tomoyasu et al.

(10) Patent No.: US 7,505,879 B2
(45) Date of Patent: Mar. 17, 2009

(54) METHOD FOR GENERATING MULTIVARIATE ANALYSIS MODEL EXPRESSION FOR PROCESSING APPARATUS, METHOD FOR EXECUTING MULTIVARIATE ANALYSIS OF PROCESSING APPARATUS, CONTROL DEVICE OF PROCESSING APPARATUS AND CONTROL SYSTEM FOR PROCESSING APPARATUS

(75) Inventors: Masayuki Tomoyasu, Yamanashi (JP); Hin Oh, Shanghai (CN); Hideki Tanaka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 80 days.

(21) Appl. No.: 11/003,829

(22) Filed: Dec. 6, 2004

(65) Prior Publication Data

US 2005/0143952 A1 Jun. 30, 2005

Related U.S. Application Data

(63) Continuation of application No. PCT/JP03/07132, filed on Jun. 5, 2003.

(30) Foreign Application Priority Data

Jun. 5, 2002 (JP) .............................. 2002-163869
Jun. 10, 2002 (JP) .............................. 2002-168653

(51) Int. Cl.
*G06F 7/60* (2006.01)
(52) U.S. Cl. ............................. 703/2; 700/29; 700/108; 700/109; 700/121
(58) Field of Classification Search ...................... 703/2
See application file for complete search history.

(56) References Cited

U.S. PATENT DOCUMENTS 5,179,701 A * 1/1993 Chisholm ................ 707/104.1

(Continued)

FOREIGN PATENT DOCUMENTS

JP          06-132251          5/1994

(Continued)

OTHER PUBLICATIONS

Yue et al, "Fault Detection of Plasma Etchers Using Optical Emission Spectra", IEEE Transactions of Semiconductor Manufacturing, vol. 13, No. 3, Aug. 2000.*

(Continued)

*Primary Examiner*—Paul L Rodriguez
*Assistant Examiner*—Mary C Jacob
(74) *Attorney, Agent, or Firm*—Finnegan, Henderson, Farabow, Garrett & Dunner, LLP

(57) ABSTRACT

According to the present invention, multivariate analysis model expressions are generated for a plasma processing apparatus 100A and a plasma processing apparatus 100B by executing a multivariate analysis of detection data provided by a plurality of sensors included in each plasma processing apparatus when the plasma processing apparatuses 100A and 100B operate based upon first setting data. Then, when the plasma processing apparatus 100A operates based upon new second setting data, detection data provided by the plurality of sensors in the plasma processing apparatus 100A are used to generate a corresponding multivariate analysis model expression, and by using the new multivariate analysis model expression corresponding to the plasma processing apparatus 100A generated based upon the second setting data and to the plasma processing apparatus 100B, a multivariate analysis model expression corresponding to the new second setting data is generated four the plasma processing apparatus 100B.

14 Claims, 7 Drawing Sheets

U.S. PATENT DOCUMENTS

| | | | |
|---|---|---|---|
| 5,568,402 A * | 10/1996 | Gray et al. | 709/224 |
| 5,658,423 A * | 8/1997 | Angell et al. | 438/9 |
| 6,153,115 A * | 11/2000 | Le et al. | 216/60 |
| 6,521,080 B2 * | 2/2003 | Balasubramhanya et al. | 156/345.24 |
| 6,590,179 B2 * | 7/2003 | Tanaka et al. | 219/121.43 |
| 6,678,570 B1 * | 1/2004 | Pasadyn et al. | 700/109 |
| 6,714,833 B2 * | 3/2004 | Nakano et al. | 700/121 |
| 6,718,224 B2 * | 4/2004 | Firth et al. | 700/121 |
| 6,917,845 B2 * | 7/2005 | Hsiung et al. | 700/104 |
| 7,254,453 B2 * | 8/2007 | Markle et al. | 700/28 |
| 7,263,463 B2 * | 8/2007 | Yamazaki | 702/182 |
| 7,297,287 B2 * | 11/2007 | Fatke et al. | 216/59 |
| 2002/0072809 A1 * | 6/2002 | Zuraw | 700/9 |

FOREIGN PATENT DOCUMENTS

| | | |
|---|---|---|
| JP | 10-125660 | 5/1998 |
| JP | 11-087323 | 3/1999 |
| JP | 11-094735 | 4/1999 |
| JP | 2002-025981 | 1/2002 |
| JP | 2002-100622 | 4/2002 |
| WO | WO 01/18845 A1 | 3/2001 |
| WO | WO 02-03441 A1 | 1/2002 |
| WO | WO 02/23289 A2 | 3/2002 |

OTHER PUBLICATIONS

Lee et al, "RTSPC: A Software Utility for Real-Time SPC and Tool Data Analysis", IEEE Transactions on Semiconductor Manufacturing, vol. 8, No. 1, Feb. 1995.*

Lee et al, "Prediction of Wafer State After Plasma Processing Using Real-time Tool Data", IEEE Transactions on Semiconductor Manufacturing, vol. 8, No. 3, Aug. 1995.*

Huang, Herbert Wiley, "Adaptive and Predictive Modeling for Real-Time Statistical Process Control", Electrical Engineering and Computer Sciences, University of California at Berkley, 1996, obtained from http://bcam.berkeley.edu/ARCHIVE/theses/hhuangMS.pdf.*

Wang et al, "Recursive Partial Least Squares Algorithms for Monitoring Complex Industrial Processes", Control Engineering Practice 11, pp. 613-632, 2003, available online Mar. 4, 2003.*

Qin, S. Joe, "Recursive PLS Algorithms for Adaptive Data Modeling" Computers and Chemical Engineering, vol. 22, No. 4/5, pp. 503-514, 1998.*

Hoeskuldsson, Agnar, "PLS Regression Methods", Journal of Chemometrics, vol. 2, pp. 221-228, (1988).

Notification of Reasons for Refusal in Japanese Applicaiton No. 2004-512183, dated Jun. 17, 2008.

* cited by examiner

METHOD FOR GENERATING MULTIVARIATE ANALYSIS MODEL EXPRESSION FOR PROCESSING APPARATUS, METHOD FOR EXECUTING MULTIVARIATE ANALYSIS OF PROCESSING APPARATUS, CONTROL DEVICE OF PROCESSING APPARATUS AND CONTROL SYSTEM FOR PROCESSING APPARATUS

CROSS REFERENCE TO RELATED APPLICATIONS

This is a continuation application of PCT International Application No. PCT/JP03/07132, filed Jun. 5, 2003, which claimed priority of Japanese Patent Application Nos. 2002-163869, filed Jun. 5, 2002; and 2002-168653, filed Jun. 10, 2002.

BACKGROUND OF THE INVENTION

1. Field of the Invention

The present invention relates to a method for generating a multivariate analysis model expression for a processing apparatus, a method for executing a multivariate analysis of a processing apparatus, a control device of a processing apparatus and a control system for a processing apparatus.

2. Description of the Related Art

Various types of processing apparatuses are employed in semiconductor manufacturing processes. Processing apparatuses such as plasma processing apparatuses are commonly utilized during a film formation process through which a film is formed on a workpiece such as a semiconductor wafer or a glass substrate and an etching process through which the workpiece is etched. The individual processing apparatuses manifest inherent processing characteristics when processing a specific type of workpiece. Accordingly, the wafer processing is optimized by monitoring the processing characteristics of each apparatus or by predicting the processing characteristics of each apparatus.

For instance, Japanese Patent Laid Open Publication No. 06-132251 proposes a method for monitoring a plasma etching apparatus engaged in an etching operation. In this method, the relationships of the results of plasma spectroscopic analysis are ascertained in advance and changes in processing conditions (the pressure, the gas flow rates, the bias voltage, etc.) to the etching results (the uniformity, the dimensional accuracy, the shape, the selectivity with respect to the base film) and they are stored in a database so as to enable indirect monitoring of the processing results without having to directly inspect the wafer. If the monitored processing results do not clear the inspection criteria, NG information is output to the etching apparatus which is then allowed to modify the processing conditions or to halt the processing and, at the same time, the managing personnel are alerted.

In addition, Japanese Patent Laid Open Publication No. 10-125660 proposes a process monitoring method about a plasma processing apparatus. In this method, a model expression that correlates an electrical signal indicating the state of the plasma with the plasma processing characteristics is generated by processing test wafers prior to the actual process, and the detection value indicated by the electrical signal obtained while processing production wafers is used for substitution in the model expression to predict and diagnose the plasma state.

Japanese Patent Laid Open Publication No. 11-87323 proposes a method for monitoring a process by using a plurality of parameters in a semiconductor wafer processing system and an apparatus in which the method is adopted. In the method proposed in this publication, a plurality of process parameters are analyzed and changes occurring in the processing characteristics or in the system characteristics are detected based upon a statistical correlation of these parameters. The plurality of process parameters used in the method include light emission parameters, environmental parameters (the pressure, the temperature etc., inside the reaction chamber), RF power parameters (the reflectivity, the synchronizing voltage etc.) and system parameters (the specific system configuration and the control voltage).

However, with the technologies in the related art, a model expression is generated by analyzing various types of measurement data through a statistical method such as a multivariate analysis and the state and the processing characteristics of the processing apparatus are ascertained and monitored by using this model expression. Thus, the model expression generated in correspondence to a given processing apparatus cannot be directly utilized in conjunction with other processing apparatuses of the same type if the processing characteristics of the individual processing apparatuses are not consistent, e.g., if the characteristics of the individual sensors installed in the processing apparatuses are not completely uniform, which necessitates the model expression to be generated for each processing apparatus by taking in various types of measurement data and thus, the model expression generation is a labor-intensive, time-consuming process. In addition, each time the processing conditions are adjusted, the model expression must be generated by taking in various types of measurement data in correspondence to the specific set of processing conditions, which also makes the model expression generation a labor-intensive and time-consuming process.

An object of the present invention, which has been completed by addressing the problems discussed above, is to provide a method for generating a multivariate analysis model expression for a processing apparatus and a method for executing a multivariate analysis on a processing apparatus, through which a model expression generated in correspondence to a single processing apparatus can be utilized in conjunction with other processing apparatuses of the same type even when the processing characteristics or the processing conditions of the individual processing apparatuses are not consistent so as to reduce the onus of the model expression generation by eliminating the need to generate anew model expression for each processing apparatus from scratch and to enable an evaluation of the state of each processing apparatus without having to generate a new model expression in correspondence to each processing apparatus.

SUMMARY OF THE INVENTION

In order to achieve the object described above, a first aspect of the present invention provides a method for generating a multivariate analysis model expression used to evaluate the apparatus state of a processing apparatus or to predict the results of processing executed at the processing apparatus through a multivariate analysis, comprising a first step in which a correlation of detection data provided by a plurality of sensors in the processing apparatus with first setting data is ascertained through multivariate analysis for each processing apparatus among a plurality of processing apparatuses that operate based upon the first setting data, a second step in which a correlation of detection data provided by the plurality of sensors in one of the plurality of processing apparatuses designated as a reference processing apparatus when the reference processing apparatus operates based upon new second setting data with the second setting data is ascertained through multivariate analysis; a third step in which a correlation of detection data with the second setting data in another processing apparatus that is not the reference processing apparatus is ascertained based upon the correlation determined through the first step for the other processing apparatus, the correlation determined through the first step for the reference processing apparatus and the correlation determined through the second step for the reference processing apparatus, and a fourth step in which a multivariate analysis model expression to be used to evaluate an apparatus state of the other processing apparatus or to predict processing results in the other processing apparatus is generated based upon the correlation thus ascertained.

In order to achieve the object described above, a second aspect of the present invention provides a method for executing a multivariate analysis of a processing apparatus to evaluate an apparatus state of the processing apparatus or predict the processing results to be achieved in the processing apparatus through multivariate analysis, comprising a first step in which a correlation of detection data provided by a plurality of sensors in the processing apparatus with first setting data is ascertained through multivariate analysis for each processing apparatus among a plurality of processing apparatuses that operate based upon the first setting data; a second step in which a correlation of detection data provided by the plurality of sensors in one of the plurality of processing apparatuses designated as a reference processing apparatus when the reference processing apparatus operates based upon new second setting data with the second setting data is ascertained through multivariate analysis; a third step in which a correlation of detection data with the second setting data in another processing apparatus that is not the reference processing apparatus is ascertained based upon the correlation determined through the first step for the other processing apparatus, the correlation determined through the first step for the reference processing apparatus and the correlation determined through the second step for the reference processing apparatus, and a fourth step in which a multivariate analysis model expression to be used to evaluate an apparatus state of the other processing apparatus or to predict processing results in the other processing apparatus is generated based upon the correlation the ascertained.

In addition, in the first aspect and the second aspect of the present invention, the correlation between the second setting data and the detection data in the other processing apparatus may be determined in the third step based upon a proportional relationship between the correlation of the detection data with the second setting data in the other processing apparatus relative to the correlation ascertained through the first step for the other processing apparatus and the correlation ascertained through the second step for the reference processing apparatus relative to the correlation ascertained through the first step for the reference processing apparatus. Also, the multivariate analysis may be executed by adopting, for instance, the method of partial least squares.

The processing apparatuses in the first aspect and the second aspect of the present invention may be plasma processing apparatuses. The setting data in such a case may be constituted with a plurality of control parameters with which the state of the plasma can be controlled and the detection data may be constituted with at least one parameter or two or more parameters selected from a group of parameters including a plurality of plasma state parameters indicating the plasma state, a plurality of apparatus state parameters related to the apparatus state and parameters that reflect the processing results.

In the second aspect of the present invention, the multivariate analysis model expression may be a correlational expression indicating a correlation of detection data calculated based upon the correlation determined through the third step for the other processing apparatus and the second setting data with the second setting data.

In order to achieve the object described above, a third aspect of the present invention provides A control device of a processing apparatus, included in the processing apparatus which processes a workpiece to control the processing apparatus based upon specific setting data, and has a transmission/reception section capable of data exchange through a connection with a network with which the processing apparatus and a host apparatus at least are connected. The control device transmits the first setting data and detection data provided by a plurality of sensors in the processing apparatus operating based upon the first setting data to the host apparatus via the network by engaging the transmission/reception section in operation, receives a correlation between the first setting data and the detection data ascertained by the host apparatus through a multivariate analysis from the host apparatus via the network by engaging the transmission/reception section in operation, transmits new second setting data to the host apparatus via the network by engaging the transmission/reception section and receives data indicating a correlation between the second setting data and detection data corresponding to the second setting data, which is ascertained by the host apparatus based upon the transmitted data via the network by engaging the transmission/reception section in operation, and the control device generates a multivariate analysis model expression based upon the correlation with regard to the second setting data received from the host apparatus, evaluates the apparatus state of the processing apparatus or predicts the processing results to be achieved in the processing apparatus based upon the multivariate analysis model expression and controls the processing apparatus based upon the results of the evaluation or the prediction.

In the third aspect of the present invention, the control device may calculate detection data corresponding to the processing apparatus to be achieved by operating the processing apparatus under conditions identical to the conditions set for a specific process executed in the other processing apparatus based upon setting data of the other processing apparatus used to generate a multivariate analysis model expression for evaluating the apparatus state or predicting the processing results when the specific process is executed in the other apparatus, which are received by the transmission/reception section via the network, and the correlation ascertained for the processing apparatus.

In addition, in the third aspect of the present invention, the setting data may be calculated for the other processing apparatus based upon a correlation of setting data of the other processing apparatus with the detection data provided by the plurality of sensors in the other processing apparatus operating based upon the setting data, which is determined through a multivariate analysis prior to the specific process and detection data provided by the plurality of sensors in the other processing apparatus while executing the specific process.

In the third aspect of the present invention, the host apparatus may calculate the correlation with regard to the second setting data in the processing apparatus is calculated by the host apparatus based upon the correlation with regard to the first setting data in the processing apparatus determined by the host apparatus through multivariate analysis, a correlation of detection data provided by a plurality of sensors in a reference processing apparatus operating based upon the first setting data with the first setting data, which is determined by the host apparatus through multivariate analysis, and a correlation of detection data provided by the plurality of sensors in the reference processing apparatus operating based upon the second setting data with the second setting data, which is determined by the host apparatus through multivariate analysis.

The processing apparatus in the third aspect of the present invention may be a plasma processing apparatus. The setting data in such a case may be constituted with a plurality of control parameters with which the state of the plasma can be controlled and the detection data may be constituted with at least one parameter or two or more parameters selected from a group of parameters including a plurality of plasma state parameters indicating the plasma state, a plurality of apparatus state parameters related to the apparatus state and parameters that reflect the processing results. In addition, the multivariate analysis may be executed by adopting a method of partial least squares.

In order to achieve the object described above, a fourth aspect of the present invention provides A control system for processing apparatuses that process workpieces, each having a control device that controls the processing apparatus based upon specific setting data, which comprises a plurality of processing apparatuses each connected to a network via a transmission/reception section and a host apparatus connected to the network. Upon receiving first setting data and detection data provided by a plurality of sensors in each processing apparatus among the plurality of processing apparatuses operating based upon the first setting data from the plurality of processing apparatuses via the network, the host apparatus ascertains a correlation between the first setting data and the detection data having been received through multivariate analysis in correspondence to each processing apparatus and transmits the correlation thus ascertained to the corresponding processing apparatus via the network. Upon receiving new second setting data and detection data provided by the plurality of sensors in one of the processing apparatuses designated as a reference processing apparatus operating based upon the second setting data from the reference processing apparatus via the network, the host apparatus ascertains a correlation between the second setting data and the detection data having been received through multivariate analysis and transmits the correlation thus ascertained to the reference processing apparatus via the network. Upon receiving the second setting data from another processing apparatus that is not the reference processing apparatus via the network, the host apparatus ascertains a correlation between the received second setting data and detection data corresponding to the second setting data based upon the correlation with regard to the first setting data in the other processing apparatus ascertained through the multivariate analysis, the correlation with regard to the first setting data in the reference processing apparatus ascertained through the multivariate analysis and the correlation with regard to the second setting data in the reference processing apparatus having been ascertained through the multivariate analysis and transmits the correlation thus ascertained to the other processing apparatus via the network. The other processing apparatus generates a multivariate analysis model expression based upon the correlation with regard to the second setting data received from the host apparatus, the apparatus state of the processing apparatus is evaluated or the processing results to be achieved in the processing apparatus are predicted based upon the multivariate analysis model expression, and the processing apparatus is controlled based upon the evaluation results or the prediction results.

The processing apparatuses in the fourth aspect of the present invention may be plasma processing apparatuses. The setting data in such a case may be constituted with a plurality of control parameters with which the state of the plasma can be controlled and the detection data may be constituted with at least one parameter or two or more parameters selected from a group of parameters including a plurality of plasma state parameters indicating the plasma state, a plurality of apparatus state parameters related to the apparatus state and parameters that reflect the processing results. In addition, the multivariate analysis may be executed by adopting a method of partial least squares.

DETAILED DESCRIPTION OF THE PREFERRED EMBODIMENTS

Figure 1:
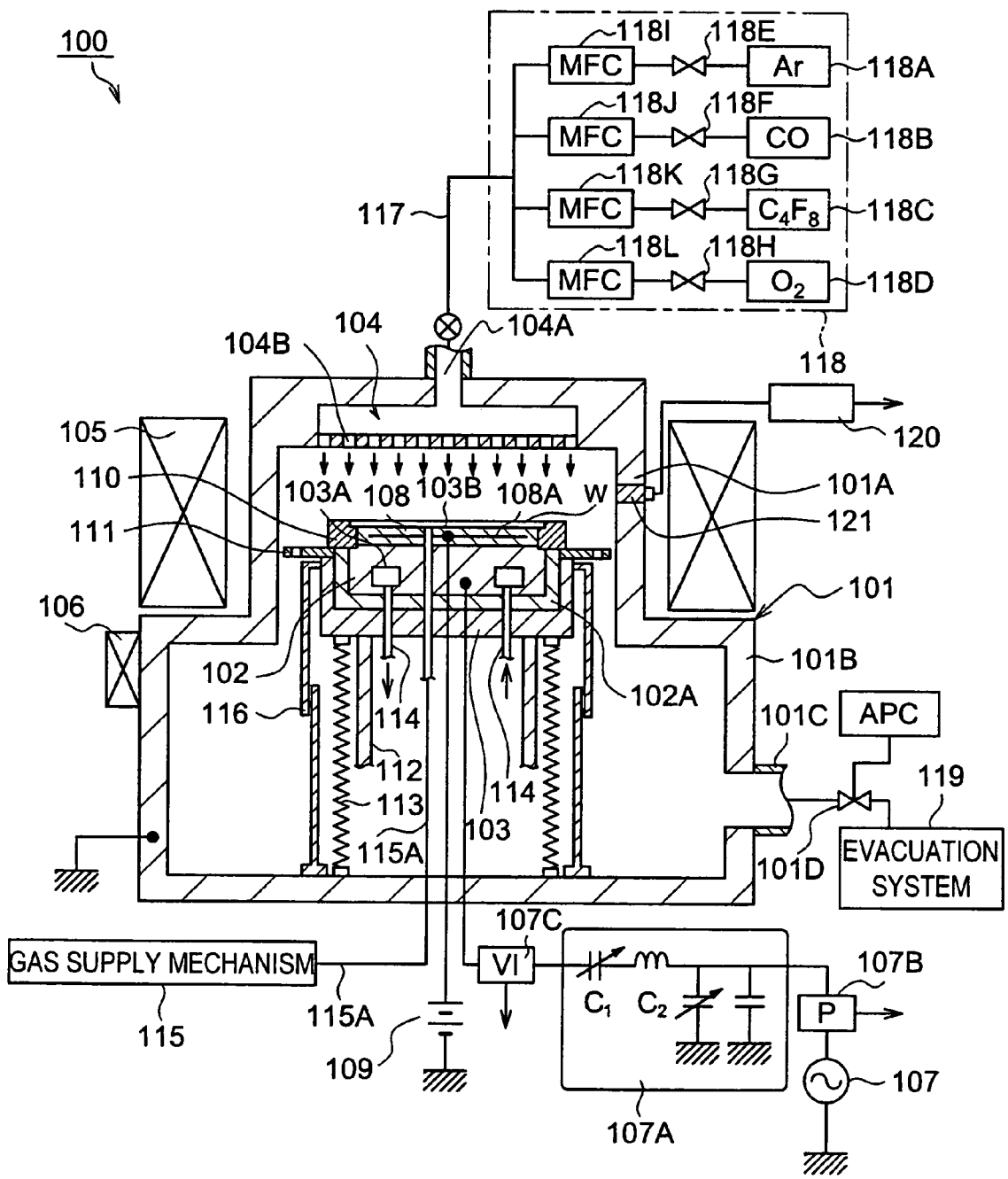
FIG. 1 is a sectional view schematically illustrating the structure adopted in the plasma processing apparatus achieved in a first embodiment of the present invention.

The following is a detailed explanation of the preferred embodiments of the apparatus according to the present invention, given in reference to the attached drawings. It is to be noted that in the specification and the drawings, the same reference numerals are assigned to components having substantially identical functions and structural features to preclude the necessity for a repeated explanation thereof.

Figure 2:
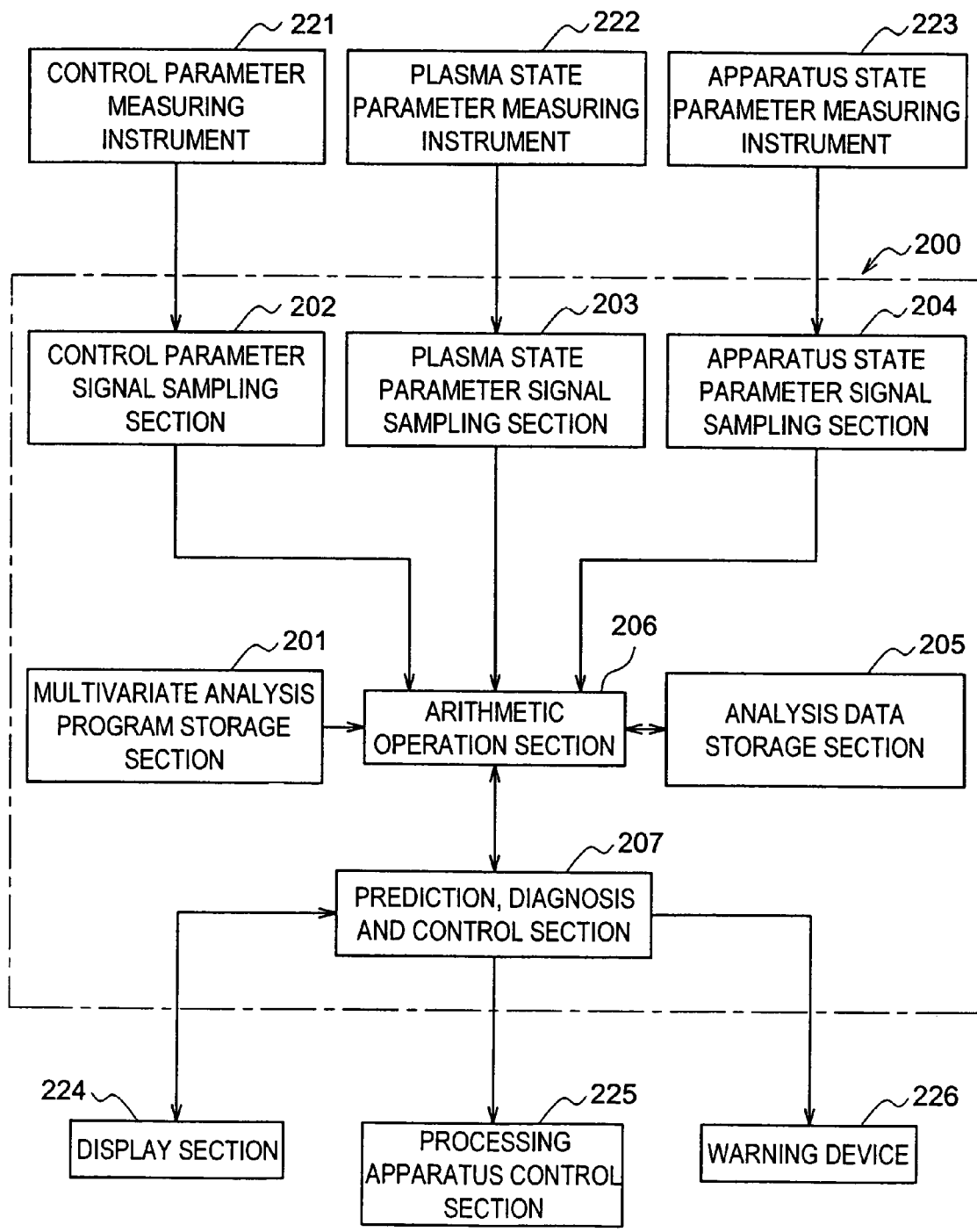
FIG. 2 is a block diagram showing an example of a multivariate analysis section included in the plasma processing apparatus in FIG. 1.

First, the plasma processing apparatus achieved in the first embodiment of the present invention is explained in reference to FIGS. 1 and 2. The plasma processing apparatus 100 achieved in the embodiment includes an aluminum processing chamber 101, an aluminum support element 103 that supports a lower electrode 102 disposed inside the processing chamber 101 via an insulating member 102A and is allowed to move up/down, and a showerhead (hereafter, it may also be referred to as an "upper electrode" when necessary) 104 through which the process gas is supplied, disposed above the support element 103 and also used as an upper electrode.

The processing chamber 101 includes an upper chamber 101A with a small diameter located over its upper portion and a lower chamber 101B with a large diameter located over its lower portion. The upper chamber 101A is surrounded by a dipole ring magnet 105. The dipole ring magnet 105, which is formed by placing a plurality of anisotropic segment columnar magnets inside a magnetic casing assuming a ring shape, forms a uniform horizontal magnetic field, which, as a whole, is aligned in a single direction, within the upper chamber 101A. An intake/outlet through which a wafer W is carried in and carried out is formed near the top of the lower chamber 101B, with a gate valve 106 mounted at the intake/outlet.

A high-frequency source 107 is connected to the lower electrode 102 via a matcher 107A, and as high-frequency power P at 13.56MHz is applied from the high-frequency source 107 to the lower electrode 102, a vertical electric field is formed between the lower electrode 102 and the upper electrode 104 inside the upper chamber 101A. The high-frequency power P is detected via a power meter 107B connected between the high-frequency source 107 and the matcher 107A. The high-frequency power P is a controllable parameter, and in the explanation of the embodiment, it is defined as one of a plurality of control parameters which include other controllable parameters such as the gas flow rates and the distance between the electrodes to be detailed later. In addition, the control parameters that can be freely set in the plasma processing apparatus may be referred to as setting data, instead.

On the side of the matcher 107A toward the lower electrode 102 (on the side on which the high-frequency voltage is output), an electrical measuring instrument (e.g., a VI probe) 107C is mounted, fundamental and higher harmonic high-frequency voltages V, high-frequency currents I and phase differences $\phi$ between the voltage waveforms and the current waveforms attributable to the plasma generated in the upper chamber 101A with the high-frequency power P applied to the lower electrode 102 via the electrical measuring instrument 107C are detected as electrical data. These electrical data and optical data which are to be detailed later are both monitorable parameters that reflect the state of the plasma, and they are referred to as plasma state parameters in the explanation of the embodiment. The plasma state parameters constituted of the data detected with the electrical measuring instrument 107C may also be referred to as detection data.

The matcher 107A, which may include internal components such as two variable capacitors C1 and C2, a capacitor C and a coil L, achieves impedance matching via the variable capacitors C1 and C2. The capacity of the variable capacitors C1 and C2 in a matched state and a high-frequency voltage Vpp measured with a measuring instrument (not shown) inside the matcher 107A, as well as the degree of openness of an APC (automatic pressure controller) to be detailed later, are parameters that indicate the state of the apparatus during processing, and the capacities of the variable capacitors C1 and C2, the high-frequency voltage Vpp and the degree of openness of the APC indicating the apparatus state are defined as apparatus state parameters in the explanation of the embodiment. The apparatus state parameters, which cannot be controlled, are constituted of detectable data, and accordingly, they may be referred to as detection data.

An electrostatic chuck 108 is disposed at the upper surface of the lower electrode 102, and a DC source 109 is connected to an electrode plate 108A of the electrostatic chuck 108. Thus, as a high voltage is applied from the DC source 109 to the electrode plate 108A in a high vacuum state, a wafer W becomes electrostatically held onto the electrostatic chuck 108. A focus ring 110 is disposed at the external circumference of the lower electrode 102 to guide the plasma generated in the upper chamber 101A onto the wafer W. In addition, an evacuation ring 111 mounted at the top of the support element 103 is disposed under the focus ring 110. A plurality of holes is formed along the entire circumference of the focus ring 110 over equal intervals along the circumferential direction, and the gas inside the upper chamber 101A is evacuated into the lower chamber 101B via these holes.

The support element 103 is allowed to move up/down between the upper chamber 101A and the lower chamber 101B via a ball screw mechanism 112 and bellows 113. When transferring the wafer W onto the lower electrode 102, the lower electrode 102 descends to the lower chamber 101B via the support element 103 and the wafer W is transferred onto the lower electrode 102 via a transfer mechanism (not shown) by opening the gate valve 106. The distance between the lower electrode 102 and the upper electrode 104 is a parameter that can be set to a specific value and is one of the control parameters mentioned earlier.

A coolant flow passage 103A connected to a coolant piping 114 is formed inside the support element 103, and a coolant supplied via the coolant piping 114 circulates through the coolant flow passage 103A to adjust the temperature of the wafer W to a predetermined level. A gas flow passage 103B is formed in the support element 103, the insulating member 102A, the lower electrode 102 and the electrostatic chuck 108, and He gas is supplied at a specific pressure as a backside gas into a narrow gap between the electrostatic chuck 108 and the wafer W from a gas supply mechanism 115 via a gas piping 115A so as to improve the thermal conductivity between the electrostatic chuck 108 and the wafer W via the He gas. Reference numeral 116 indicates a bellows cover.

A gas intake unit 104A is formed at the upper surface of the shower head 104, and a process gas supply system 118 is connected to the gas intake unit 104A via a piping 117. The process gas supply system 118 includes an Ar gas supply source 118A, a CO gas supply source 118B, a $C_4F_8$ gas supply source 118C and an $O_2$ gas supply source 118D. The various gases are individually supplied to the shower head 104 at specific flow rate settings from these gas supply sources 118A, 118B, 118C and 118D respectively via valves 118E, 118F, 118G and 118H and mass flow controllers 118I, 118J, 118K and 118L, and they are blended to constitute a mixed gas achieving a predetermined mixing ratio inside the shower head 104. The flow rates of the individual gases, which can be controlled through the respective mass flow controllers 118I, 118J, 118K and 118L, are detectable parameters included in the control parameters mentioned earlier.

A plurality of holes 104B are formed over the entire lower surface of the shower head 104 with uniform intervals, and the mixed gas is supplied from the shower head 104 via these holes 104B into the upper chamber 101A to be used as the process gas. In addition, an evacuation pipe 101C is connected to an evacuation hole formed toward the bottom of the lower chamber 101B, and the processing chamber 101 is evacuated via an evacuation system 119 constituted with a vacuum pump connected to the evacuation pipe 101C and the like so as to sustain the gas pressure at a specific level. An APC valve 101D is disposed at the evacuation pipe 101C and the degree of its openness is automatically adjusted in correspondence to the gas pressure inside the processing chamber 101. This degree of openness is an apparatus state parameter indicating the apparatus state, which cannot be controlled.

At the sidewall of the processing chamber 101, a detection window 121 is disposed, and a spectrometer (hereafter referred to as an "optical measuring instrument") 120 that detects the plasma light emission occurring inside the processing chamber 101 over multiple wavelengths via the detection window 121 is disposed on the exterior side of the sidewall of the processing chamber 101. Based upon optical data corresponding to specific wavelengths, which are obtained by the optical measuring instrument 120, the state of the plasma is monitored in order to detect, for instance, the end point of plasma processing. Together with the electrical data related to the plasma generated by applying the high-frequency power P, these optical data constitute the plasma state parameters indicating the plasma state.

Next, in reference to a drawing, a multivariate analysis section included in the plasma processing apparatus 100 described above is explained. The plasma processing apparatus 100 includes a multivariate analysis section 200 such as that shown in FIG. 2 the multivariate analysis section 200 comprises a multivariate analysis program storage section 201 in which a multivariate analysis program is stored, a control parameter signal sampling section 202 that intermittently samples a detection signal provided by a control parameter measuring instrument 221, a plasma state parameter signal sampling section 203 that intermittently samples a detection signal provided by a plasma state parameter measuring instrument 222 and a apparatus state parameter signal sampling section 204 that intermittently samples a detection signal provided by an apparatus state parameter measuring instrument 223. It also includes a analysis data storage section 205 in which analysis results such as a model expression correlating the plurality of plasma state parameters (the electrical data and the optical data), the plurality of apparatus state parameters related to the apparatus state and a plurality of control parameters and data needed to execute the analysis are stored, a arithmetic operation section 206 that determines through arithmetic operation the control parameters, the plasma state parameters and the apparatus state parameters by using the model expression for a specific purpose and a prediction/diagnosis/control section 207 that predicts, diagnoses and controls the control parameters, the plurality of plasma state parameters or the apparatus state parameters for a specific purpose based upon an arithmetic operation signal provided by the arithmetic operation section 206.

The multivariate analysis section 200 is also connected with a processing apparatus control section 225, a warning device 226 and a display section 224,that controls the plasma processing apparatus 100 based upon the control parameters. In response to a signal provided by the prediction/diagnoses/control section 207, for instance, the processing apparatus control section 225 allows the processing of the wafer W to continue or halts the processing. Based upon the signal provided by the prediction/diagnoses/control section 207, the warning device 226 and the display section 224 report on an anomaly manifesting in the control parameters, the plurality of plasma state parameters or the apparatus state parameters for a specific purpose, as detailed later. In addition, data related to the various parameters and process data achieved by processing the parameter data (process data used in the multivariate analysis) are stored in the analysis data storage section 205. It is to be noted that FIG. 2 shows a plurality of control parameter measuring instruments such as flow rate detectors, an optical measuring instrument and a high-frequency voltage Vpp measuring instrument, a plurality of plasma state parameter measuring instruments and a plurality of apparatus state parameters respectively as a single control parameter measuring instrument 221, a single plasma state parameter measuring instrument 222 and a single apparatus state parameter measuring instrument 223.

The principle of the present invention is now explained. Let us assume that a plasma processing apparatus 100A functions as a reference processing apparatus when generating a new model expression and that a plasma processing apparatus 100B is a processing apparatus other than the reference processing apparatus. There is a slight difference between the individual plasma processing apparatuses 100A and 100B due to inconsistency occurring during production and the like. In addition, complete uniformity is not achieved in the sensors such as the electrical measuring instruments 107C and the optical measuring instruments 120 in the individual plasma processing apparatuses due to manufacturing errors or the like, and for these reasons, identical detection data are not obtained from plasma processing apparatuses of the same type equipped with the same types of sensors. Thus, it is necessary to generate a multivariate analysis model expression for each of the plasma processing apparatuses of the same type and a given multivariate analysis model expression cannot be utilized as a multivariate analysis model expression for another plasma processing apparatus of the same type.

However, the embodiment makes it possible to utilize a multivariate analysis model expression generated for the plasma processing apparatus 100A, for instance, in conjunction with the other plasma processing apparatus 100B even if the individual plasma processing apparatuses 100A and 100B are not completely uniform due to manufacturing inconsistencies and there is also inconsistency among the individual sensors included in the plasma processing apparatuses 100A and 100B. In the embodiment, the multivariate analysis is executed by adopting the method of partial least squares (hereinafter referred to as the "PLS method") to generate multivariate analysis model expressions for the individual plasma processing apparatuses 100A and 100B, based upon which the difference between the individual apparatuses is ascertained, and then a model expression absorbing this inherit difference is generated. The PLS method is explained in detail in, for instance, the Journal of Chemometrics, VOL. 2 (pp. 211~228) (1988).

For each of the plasma processing apparatuses 100A and 100B, a recurrent expression (hereinafter simply referred to as a "model expression") expressed in (1) below that correlates a matrix X containing as components thereof objective variables constituted of the plurality of control parameters (setting data) to a matrix Y containing as components thereof explanatory variables constituted with the plurality of plasma state parameters (detection data such as the electrical data and the optical data) is generated (a first step).

The arithmetic operation section 206 in the plasma processing apparatuses 100A and 100B respectively calculate recurrent matrices Ka and Kb in model expressions through a method of multivariate analysis, i.e., the PLS method in this case, based upon their own explanatory variables and objective variables obtained by conducting tests and store the respective model expressions into the analysis data storage section 205. It is to be noted that in the model expressions in (1) and (2) provided below, Ka and Kb represent the recurrent matrices of the respective model expressions, a indicates the plasma processing apparatus 100A and b indicates the plasma processing apparatus 100B.

$$Xa = KaYa \tag{1}$$

$$Xb = KbYb \tag{2}$$

By adopting the PLS method, a relational expression indicating the relationship between the matrix X and the matrix Y can be determined even if both matrices X and Y contain numerous explanatory variables and numerous objective variables, as long as they each contain a few measured values. The advantages of the PLS method include high degrees of stability and reliability of the relational expression obtained based upon a small number of measured values. When measuring the various types of data constituting the explanatory variables and the objective variables, the control parameters are detected at different settings and the plasma state parameters are detected with a plurality of sensors.

If a given control parameter (the high-frequency power, the chamber internal pressure, the process gas flow rate or the like) is varied within a narrow range, the control parameter can be approximated in a linear expression, as indicated in (3) below, whereas if the parameter is varied over a wide range, the control parameter can be approximated in a nonlinear expression that includes squares, cubes and linear/quadratic alternating terms, as indicated in (4) below.

Ranges and values assumed for these control parameters are the same in the plasma processing apparatus 100A and the plasma processing apparatus 100B. Since the recurrent matrices Ka and Kb can be determined through an arithmetic operation procedure identical to the PLS procedure proposed in Japanese Patent Application No. 2001-398608 by the applicant of the present invention, an explanation of the arithmetic operation procedure is omitted. The difference between the individual plasma processing apparatuses 100A and 100B and the differences between the individual sensors manifest as the difference between the recurrent matrices Ka and Kb indicated in (1) and (2).

$$X = (x1, x2, \ldots xn) \tag{3}$$

$$X = [x1, x2, \ldots xn, (x1)^2, (x2)^2, \ldots (xn)^2, (x1)^3, (x2)^3, \ldots (xn)^3, x1x2, x1x3, \ldots xn-1, xn(x)^2 x2, (x)^2 x3 \ldots (xn-1)^2 xn] \tag{4}$$

When determining the model expressions described above through the PLS method, the plurality of explanatory variables and the plurality of objective variables are measured in advance by conducting tests on sets of training wafers. For these purposes, sets of training wafers, each set containing 18 wafers (TH-OX Si) are prepared. It is to be noted that "TH-OX Si" indicates that a thermal oxide film is formed at the wafers. By planning the tests so as to set the control parameters (setting data) efficiently, the number of tests to be conducted can be minimized.

In the plasma processing apparatus 100A, the control parameters used as the objective variables are each adjusted within a predetermined range centered around a standard value when etching a given training wafer. During the etching process, the control parameters such as the flow rates of the individual gases constituting the process gas and the chamber internal pressure and the plasma state parameters constituted with the electrical data and the optical data are measured multiple times for each training wafer, and the average values of the individual control parameters and plasma state parameters are calculated via the arithmetic operation section 206. Then, the average values of the individual control parameters are used as setting data and the average values of the individual plasma state parameters are used as detection data.

A control parameter is varied within the range over which the control parameter is assumed to fluctuate to the maximum extent during the etching process. In the embodiment, the high-frequency power, the chamber internal pressure, the distance between the upper and lower electrodes 102 and 104 and the flow rates of the individual gases (Ar gas, CO gas, $C_4F_8$ gas and $O_2$ gas) constituting the process gas are used as the control parameters (setting data). The standard value of each control parameter changes depending upon the type of workpiece being etched. In the plasma processing apparatus 100B, too, tests are conducted by setting identical control parameters (setting data) through a procedure identical to that adopted in the plasma processing apparatus 100A and the control parameters (setting data) and the plasma state parameters (detection data) are obtained.

More specifically, each training wafer is etched by adjusting the control parameters within the ranges between levels 1 and 2 centered around the respective standard values, as indicated in Table 1 below. While a given training wafer is being processed, electrical data such as the high-frequency voltages (from the fundamental wave to the quadruple wave) V and the high-frequency currents (from the fundamental wave to the quadruple wave) I and the phase differences φ attributable to the plasma are measured as detection data via the electrical measuring instrument 107C, the emission spectrum intensity (optical data) within, for instance, a wavelength range of 200 through 950 nm, is measured as detection data via the optical measuring instrument 120, and these detection data (the electrical data and the optical data) are used as the plasma state parameters. In addition, the individual control parameters indicated in Table 1 below are measured via the respective control parameter measuring instruments 221.

TABLE 1

|  | Power W | Pressure mTorr | Distance mm | Ar sccm | CO sccm | $C_4F_8$ sccm | $O_2$ sccm |
|---|---|---|---|---|---|---|---|
| Level 1 | 1460 | 38 | 25 | 170 | 36 | 9.5 | 3.5 |
| Standard Value | 1500 | 40 | 27 | 200 | 50 | 10 | 4 |
| Level 2 | 1540 | 42 | 29 | 230 | 64 | 10.5 | 4.5 |
|  | 2.67% | 5.00% | 7.41% | 15.00% | 28.00% | 5.00% | 12.50% |

Before processing the training wafers, five dummy wafers are first processed in each plasma processing apparatus with the individual control parameters set to the standard values determined in correspondence to the specific type of thermal oxide film so as to stabilize the plasma processing apparatuses 100A and 100B. Then, the plasma processing apparatuses 100A and 100B are each engaged in operation to etch 18 training wafers. In the plasma processing apparatus 100A, each training wafer is processed after the individual control parameters, i.e., the flow rates of the individual gases (Ar, CO, $C_4F_8$ and $O_2$) constituting the processed gas, the chamber internal pressure and the high-frequency power are adjusted within the respective ranges between level 1 and level 2 explained earlier.

Next, a plurality of sets of electrical data and a plurality of sets of optical data are obtained from the respective measuring instruments in correspondence to each training wafer. These data are stored as measurement values into, for instance, the analysis data storage section 205. Then, the average value of the measurement values corresponding to each of the plurality of control parameters and the average value of the measurement values corresponding to each of the plurality of plasma state parameters (electrical data, optical data) are calculated by the arithmetic operation section 206, and these average values are stored into the analysis data storage section 205 as the objective variables and the explanatory variables. Subsequently, the arithmetic operation section 206 determines the recurrent matrix Ka in the model expressions in (1) based upon these arithmetic operation data through the PLS procedure (the first step).

In addition, in the plasma processing apparatus 100B, the control parameters are varied as indicated in Table 2 provided below, the average values of the measurement values corresponding to the individual parameters are calculated, and the recurrent matrix Kb in the model expression in (2) is determined by using these average values as the objective variables and the explanatory variables (the first step). It is to be noted that L1 through L18 in Table 2 below indicate the numbers assigned to the individual training wafers.

TABLE 2

| NO. | Pressure mTorr | Ar sccm | CO sccm | $C_4F_8$ sccm | $O_2$ sccm | Distance mm | Power W |
|---|---|---|---|---|---|---|---|
| L1 | 42 | 170 | 64 | 10 | 4.5 | 25 | 1500 |
| L2 | 38 | 200 | 36 | 9.5 | 4.5 | 29 | 1500 |
| L3 | 40 | 230 | 64 | 9.5 | 3.5 | 27 | 1500 |
| L4 | 42 | 170 | 50 | 9.5 | 4.5 | 27 | 1540 |
| L5 | 38 | 170 | 36 | 9.5 | 3.5 | 25 | 1460 |
| L6 | 38 | 200 | 50 | 10 | 4 | 27 | 1500 |
| L7 | 38 | 230 | 50 | 10 | 3.5 | 25 | 1540 |
| L8 | 38 | 230 | 64 | 10.5 | 4.5 | 29 | 1540 |
| L9 | 42 | 200 | 64 | 10 | 3.5 | 29 | 1460 |
| L10 | 40 | 170 | 50 | 10.5 | 3.5 | 29 | 1500 |
| L11 | 40 | 200 | 64 | 9.5 | 4 | 25 | 1540 |
| L12 | 42 | 200 | 36 | 10.5 | 3.5 | 27 | 1540 |
| L13 | 42 | 230 | 36 | 10.5 | 4 | 25 | 1500 |
| L14 | 40 | 230 | 36 | 10 | 4.5 | 27 | 1460 |
| L15 | 40 | 200 | 50 | 10.5 | 4.5 | 25 | 1460 |
| L16 | 42 | 230 | 50 | 9.5 | 3.5 | 29 | 1460 |
| L17 | 40 | 170 | 36 | 10 | 3.5 | 29 | 1540 |
| L18 | 38 | 170 | 64 | 10.5 | 3.5 | 27 | 1460 |

After the recurrent matrices Ka and Kb are determined, the plasma processing apparatus 100A is engaged in operation to process 20 test wafers (TH-OX Si) with the control parameters such as the flow rates of the gases constituting the process gas deviated relative to the respective standard values as indicated in Table 3 below under new processing conditions also indicated in Table 3, and the plasma state parameters and the apparatus state parameters are detected with the respective sensors during the process. When executing this process, the plasma processing apparatus is first operated with the plurality of control parameters set to their standard values corresponding to the specific processing conditions as indicated in Table 3 and five bare silicon wafers are supplied into the processing chamber 101 as dummy wafers to stabilize the plasma processing apparatus.

TABLE 3

| NO. | Power W | Pressure mTorr | Distance mm | Ar sccm | CO sccm | $C_4F_8$ sccm | $O_2$ sccm |
|---|---|---|---|---|---|---|---|
| Bare Si 1 | 2000 | 100 | 35 | 300 | 50 | 10 | 8 |
| Bare Si 2 | 2000 | 100 | 35 | 300 | 50 | 10 | 8 |
| Bare Si 3 | 2000 | 100 | 35 | 300 | 50 | 10 | 8 |
| Bare Si 4 | 2000 | 100 | 35 | 300 | 50 | 10 | 8 |
| Bare Si 5 | 2000 | 100 | 35 | 300 | 50 | 10 | 8 |
| TH-OX Si 6 | 2000 | 100 | 35 | 300 | 50 | 10 | 8 |
| TH-OX Si 7 | 1980 | 100 | 35 | 300 | 50 | 10 | 8 |
| TH-OX Si 8 | 1900 | 100 | 35 | 300 | 50 | 10 | 8 |
| TH-OX Si 9 | 1980 | 100 | 35 | 280 | 50 | 10 | 8 |
| TH-OX Si 10 | 2000 | 95 | 35 | 300 | 50 | 10 | 8 |
| TH-OX Si 11 | 2000 | 100 | 33 | 300 | 50 | 10 | 8 |
| TH-OX Si 12 | 2000 | 100 | 37 | 300 | 50 | 10 | 8 |
| TH-OX Si 13 | 2000 | 100 | 35 | 270 | 50 | 10 | 8 |
| TH-OX Si 14 | 2000 | 98 | 35 | 300 | 50 | 10 | 8 |
| TH-OX Si 15 | 2000 | 100 | 35 | 300 | 30 | 10 | 8 |
| TH-OX Si 16 | 2000 | 100 | 35 | 300 | 70 | 10 | 8 |
| TH-OX Si 17 | 2000 | 100 | 35 | 300 | 50 | 8 | 8 |
| TH-OX Si 18 | 2000 | 100 | 35 | 300 | 50 | 12 | 8 |
| TH-OX Si 19 | 1900 | 95 | 35 | 300 | 50 | 10 | 6 |
| TH-OX Si 20 | 1980 | 102 | 35 | 300 | 50 | 10 | 10 |
| TH-OX Si 21 | 1900 | 98 | 33 | 300 | 50 | 10 | 8 |
| TH-OX Si 22 | 1980 | 98 | 37 | 300 | 50 | 10 | 8 |
| TH-OX Si 23 | 1900 | 100 | 35 | 270 | 50 | 10 | 8 |
| TH-OX Si 24 | 1980 | 100 | 35 | 350 | 50 | 10 | 8 |
| TH-OX Si 25 | 2000 | 100 | 35 | 300 | 50 | 10 | 8 |

Namely, upon starting the operation of the plasma processing apparatus with the distance between the upper and lower electrodes 102 and 104 inside the processing chamber 101 set to 35 mm, the support element 103 descends to the lower chamber 101B of the processing chamber 101 via the ball screw mechanism 112 and a dummy wafer is transferred into the processing chamber through the intake/outlet opened via the gate valve 106 and is placed on the lower electrode 102. After the wafer W is transferred into the processing chamber, the gate valve 106 is closed and the evacuation system 119 is engaged in operation to maintain the atmosphere within the processing chamber 101 at a predetermined degree of vacuum. Through this evacuation, the degree of openness of the APC valve 101D is automatically adjusted in correspondence to the extent of displacement. At this time, the He gas supplied through the gas supply mechanism 115 acts as a back gas to improve the efficiency with which the wafer W is cooled by improving the thermal conductivity between the wafer W and the lower electrode 102, i.e., between the electrostatic check 108 and the wafer W to be more exact.

Then, the Ar gas, the CO gas, the $C_4F_8$ gas and the $O_2$ gas are supplied with their flow rates respectively set to 300 sccm, 50 sccm, 10 sccm and 8 sccm from the process gas supply system 118. At the same time, the degree of openness of the APC valve 101D is automatically adjusted in correspondence to the volume of the process gas being supplied and the extent of displacement, in order to set the pressure of the process gas inside the processing chamber 101 to 100 mTorr. 2000 W high frequency power applied from the high-frequency source 107 in this state, aided by the dipole ring magnet 105, induces a magnetron discharge, thereby generating plasma with the process gas. The initial bare silicon wafer supplied into the processing chamber is not etched. After the bare silicon wafer is processed over a predetermined length of time (e.g., 1 minute), the processed wafer W is carried out of the processing chamber 101 through a reverse operation of the wafer intake operation, and the subsequent four dummy wafers, too, are processed under the same conditions.

When the plasma processing apparatus has become stabilize through the dummy wafer processing, test wafers are processed. The first test wafer (the sixth wafer) is etched by keeping the control parameters at the standard values. While this test wafer is being processed, the electrical data and the optical data are measured as detection data a plurality of times via the electrical measuring instrument 107C and the optical measuring instrument 120, and these measurement values are stored into memory at the storage section (not shown). Then, the arithmetic operation section 206 calculates the average values of these measurement values.

The second test wafer is etched by adjusting the high frequency power from 1500 W to 1980 W with the other control parameters left at the standard values explained earlier. While the second test wafer is being etched, the electrical data and the optical data are measured as detection data through a procedure identical to that with which the detection data of the first test wafer are obtained and the individual average values are calculated.

After the second test wafer is processed, each subsequent test wafer is etched by adjusting the individual control parameters to the values indicated in Table 3, the plasma state parameters (electrical data and optical data) are measured for each test wafer and the average values of the individual plasma state parameters are calculated.

A new model expressions is then generated as indicated in (5) below in a manner similar to that with which the model expressions in (1) was generated, based upon a matrix Xa' of the average values of the control parameters and a matrix Ya' of the average values of the plasma state parameters (a second step).

$$Xa'=Ka'Ya' \quad (5)$$

When the control parameters in the plasma processing apparatus 100B are subsequently varied under the same conditions as those under which the control parameters were adjusted in the plasma processing apparatus 100A, the model expression in (5) generated for the plasma processing apparatus 100A can be utilized in conjunction with the plasma processing apparatus 100B without having to conduct the type of tests conducted in the plasma processing apparatus 100A. Namely, a matrix Xb' of the objective variables in the plasma processing apparatus 100B in which the control parameters are varied exactly as they were in the plasma processing apparatus 100A can be expressed as in (6) below. When Xb' represents the matrix of the objective variables in the plasma processing apparatus 100B, the model expression in (2) is rewritten into the model expression in (7) below.

Then, the model expression in (8) below can be obtained based upon the relationship between the model expressions indicated in (1) and (5) corresponding to the plasma processing apparatus 100A and the model expressions indicated in (2) and (7) corresponding to the plasma processing apparatus 100B. Namely, since a proportional relationship (Kb'/Ka'=Kb/Ka) is assumed to exist with regard to the recurrent matrix Ka and the new recurrent matrix Ka' in the plasma processing apparatus 100A and the recurrent matrix Kb and the new recurrent matrix Kb' in the plasma processing apparatus 100B, Kb' can be expressed as; Kb'=Ka'Kb/Ka. By substituting this relational expression for Kb' in expression (7), the expression in (8) below is obtained (a third step).

$$Xb'=Xa' \quad (6)$$

$$Xb'=Kb'Yb' \quad (7)$$

$$Xb'=(Ka'Kb/Ka)\,Yb' \quad (8)$$

Accordingly, by determining the model expression (5) in correspondence to the plasma processing apparatus 100A in advance and using the model expression (1) for the plasma processing apparatus 100A and the model expression (2) for the plasma processing apparatus 100B, which are both already available, and the model expression (7), a new model expression can be generated for the plasma processing apparatus 100B as indicated in (8) under the new set of processing conditions in which the control parameters are varied as expressed with the matrix Xb' (a fourth step).

Namely, the new model expression (8) for the plasma processing apparatus 100B can be generated by determining the recurrent matrix Ka' correlating the matrix Xa' of the average values (setting data) of the control parameters and the matrix Ya' of the average values (detection data) of the plasma state parameters in correspondence to the plasma processing apparatus 100A, which are detected under the new processing conditions. Then, the apparatus state of the plasma processing apparatus 100B can be evaluated by using the new model expression (8). This means that once the model expression (5) is generated for the plasma processing apparatus 100A through testing, the expression indicated in (8) can be generated as the new model expression of the plasma processing apparatus 100B without having to conduct any tests for the plasma processing apparatus 100B.

The new model expression (8) thus generated may be stored into the analysis data storage section 205 in the plasma processing apparatus 100B. Thus, when processing a wafer by engaging the plasma processing apparatus 100B in normal operation, the values of the plurality of control parameters can be predicted through calculation based on the average values (detection data) of the individual plasma state parameters by using the new model expression (8) stored in the analysis data storage section 205.

The prediction/diagnosis/control section 207 then compares the predicted control parameter values (predicted setting data) with the allowable fluctuation ranges actually set for the setting data in the plasma processing apparatus 100B, and if it is judged that an abnormal deviation exists, the operation of the plasma processing apparatus 100B is stopped via, for instance, the processing apparatus control section 225 and an error warning is issued through the display section 224 and the warning device 226.

As explained above, the method adopted in the embodiment includes the first step in which the correlation (Ka in expression (1), Kb in expression (2)) of the detection data (e.g., the plasma state parameters) detected via the plurality of sensors in each of the plasma processing apparatuses 100A and 100B operating based upon the first setting data (e.g., the control parameters) to the first setting data is determined through multivariate analysis for each of the plasma processing apparatuses 100A and 100B, a second step in which the correlation (Ka' in expression (5)) of the detection data detected via the plurality of sensors in the plasma processing apparatus 100A designated as the reference processing apparatus and operating based upon new second setting data (e.g., new setting data indicating the control parameters adjusted over different ranges from the ranges of the first setting data) to the second setting data is determined through multivariate analysis for the plasma processing apparatus 100A, a third step in which the correlation (Kb' in expression (8)) between the second setting data and detection data in the plasma processing apparatus 100B which is not the reference processing apparatus is determined based upon the correlation Kb determined in the first step for the plasma processing apparatus 100B, the correlation Ka determined in the first step for the plasma processing apparatus 100A and the correlation Ka' determined in the second step for the plasma processing apparatus 100A, and a fourth step in which a multivariate analysis model expression (expression (8)) to be used to evaluate the apparatus state of the plasma processing apparatus 100B or predict the processing results to be achieved in the plasma processing apparatus 100B is generated based upon the correlation Kb' thus determined.

Thus, once the model expression (5) is generated in correspondence to the reference plasma processing apparatus 100A by conducting plasma processing tests on wafers based upon new setting data under a new set of processing conditions, this new model expression (5) corresponding to the plasma processing apparatus 100A can be utilized to generate a new model expression (8) for a processing apparatus other than the reference processing apparatus, e.g., the plasma processing apparatus 100B. In other words, the new model expression (8) can be obtained for the plasma processing apparatus 100B without having to conduct any tests using the new setting data. As a result, the load of model expression generation for the plasma processing apparatus 100B can be greatly reduced.

In addition, in the third step, the correlation Kb' between the second setting data and the detection data in the plasma processing apparatus 100B is determined based upon the proportional relationship of the correlation Kb' between the second setting data and the detection data to the correlation Kb determined in first step for the plasma processing apparatus 100B and of the correlation Ka' determined in the second step to the correlation Ka determined in the first step for the plasma processing apparatus 100A. Thus, the correlation Kb' in the plasma processing apparatus 100B can be calculated with ease without having to execute multivariate analysis.

Furthermore, a multivariate analysis model expression is generated by correlating the plurality of control parameters with which the plasma state can be controlled to the plurality of plasma state parameters that indicate the plasma state in the embodiment. More specifically, the multivariate analysis model expressions (1) and (2) are generated in correspondence to the plasma processing apparatuses 100A and 100B by using the setting data (the control parameters and the like) as objective variables and using the detection data (the plasma state parameters and the like) as explanatory variables. When new setting data are introduced, only the multivariate analysis model expression (5) needs to be generated in correspondence to the plasma processing apparatus 100A to calculate the detection data (the plasma state parameters, the apparatus state parameters and the like) for the plasma processing apparatus 100B based upon the correlation Kb' and the setting data Xb' and ultimately to generate the multivariate analysis model expression (8) for the plasma processing apparatus 100B in correspondence to the new setting data.

Since the multivariate analysis model expressions are generated through the PLS procedure, the individual parameters can be predicted and evaluated with a high degree of accuracy, without having to conduct a great number of tests. In addition, by executing a principal component analysis of the values predicted for the plasma processing apparatus 100B, the operating state of the plasma processing apparatus 100B can be evaluated in an integrated manner.

Since the multivariate analysis for determining the correlation between the setting data and the detection data is executed through the PLS procedure, a highly accurate multivariate analysis is achieved even with a small volume of data to generate multivariate analysis model expressions.

Figure 3:
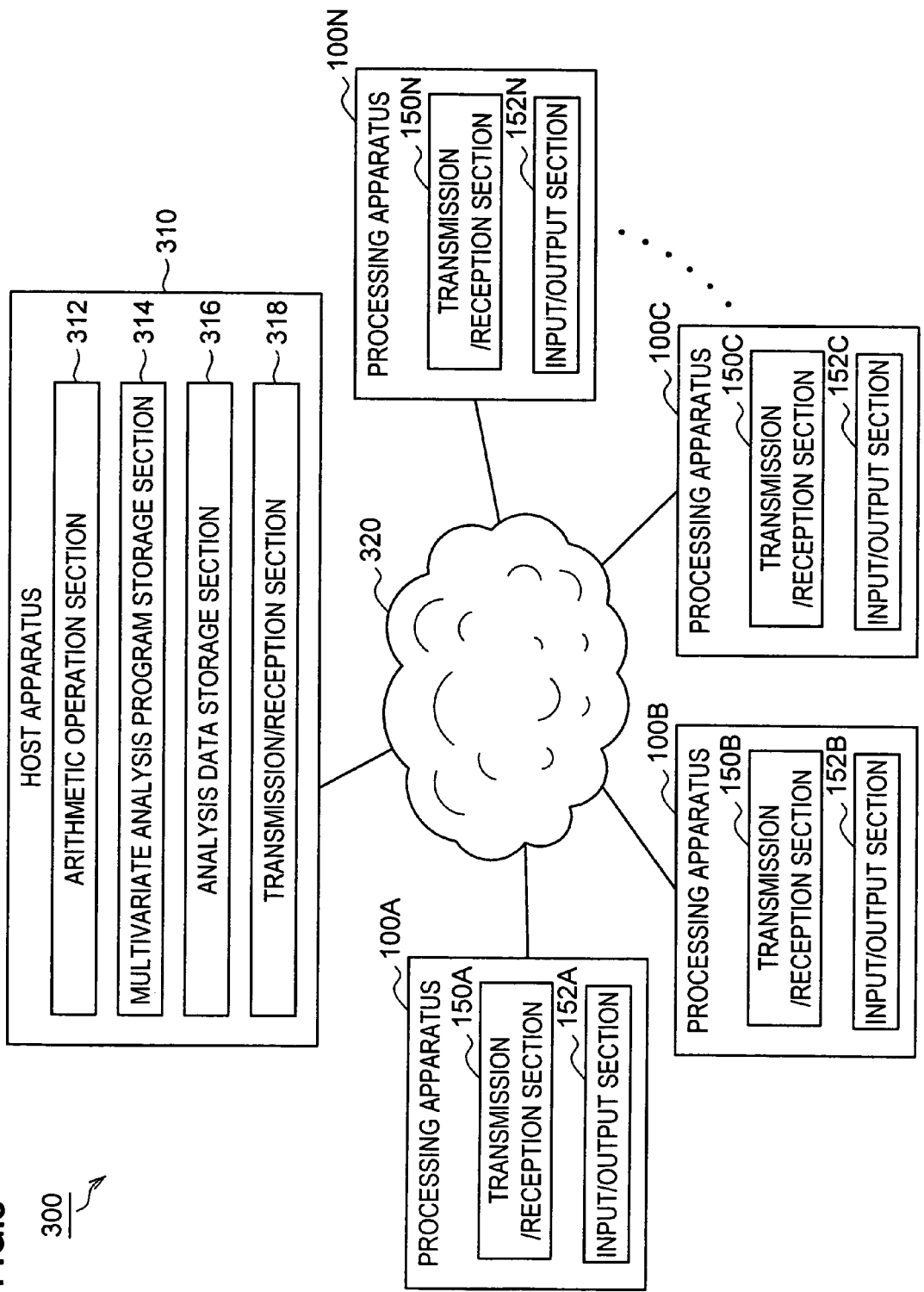
FIG. 3 is a block diagram showing the structure of the processing apparatus control system achieved in a second embodiment of the present invention.

Next, a second embodiment of the present invention is explained in reference to drawings. FIG. 3 is a block diagram schematically showing the overall structure of the control system achieved in the embodiment. A control system 300 comprises a host apparatus 310 and a plurality of plasma processing apparatuses 100A, . . . , 100N connected via a network 320. Since the structures of the plasma processing apparatuses 100A, . . . , 100N are all similar to that shown in FIG. 1, their structures are not explained in detail. The plasma processing apparatuses 100A, . . . , 100N each include the multivariate analysis section 200 such as that shown in FIG. 2. It is to be noted that the multivariate analysis section 200 and the processing apparatus control section 225 shown in FIG. 2, for instance, and a transmission/reception device 150 shown in FIG. 3 together fulfill the functions of a control device in each processing apparatus in the embodiment.

The host apparatus 310 includes at least a arithmetic operation section 312 that executes various types of arithmetic operations, a multivariate analysis program storage section 314 in which a multivariate analysis program adopting the PLS method described above or the like is stored, a analysis data storage section 316 in which analysis results and data needed to execute the analysis are stored and a transmission/reception section 318 that exchanges data with the individual plasma processing apparatuses 100A . . . 100N via the network 320. It is to be noted that the host apparatus 310 may be, for instance, a host computer installed in a semiconductor manufacturing plant or it may be a personal computer connected to the host computer.

The plasma processing apparatuses 100A . . . 100N respectively include transmission/reception devices 150A . . . 15ON through which various types of data are exchanged between the individual plasma processing apparatuses 100A . . . 100N and the host apparatus 310 or among the plasma processing apparatuses 100A . . . 100N and a input section 152A . . . and 152N through which various types of data such as control parameters (setting data) are input. The transmission/reception devices 150A . . . 150N are individually connected to the respective the multivariate analysis section 200 shown in FIG. 2 so as to exchange data with the multivariate analysis section 200 in the individual plasma processing apparatuses 100A . . . 100N.

The network 320, which connects the host apparatus 310, the individual plasma processing apparatuses 100A . . . 100N and the like so as to enable bidirectional communication is typically a public network such as the Internet. Alternatively, the network 320 may be a closed network such as a WAN (wide area network), a LAN (local area network), an IP-VPN (Internet protocol-virtual private network) or the like instead of a public network. The connection medium used to achieve a connection with the network 320 may be an optical fiber cable connected through an FDDI (fiber distributed data interface) or the like, a coaxial cable or a twisted-pair cable connected through the ethernet or a wireless medium compliant with IEEE 802.11b. It may be either a wired medium or a wireless medium, and it may even be a medium in a satellite network or the like.

When each plasma processing apparatus 100 executes an etching process under desired processing conditions, data needed for generating a new model expression to be used to evaluate the apparatus state are transmitted from the host apparatus 310 to the specific plasma processing apparatus 100 via the transmission/reception device 150 and, as a result, the onus placed on the multivariate analysis section 200 of the plasma processing apparatus 100 when generating the model expression is reduced. Then, the apparatus state is evaluated by using the new model expression based upon the various types of detection data obtained while wafers are actually processed in the plasma processing apparatus 100, and the processing apparatus control section 225 controls the plasma processing apparatus 100 in response to an instruction output from the prediction/diagnosis/control section 207 based upon the evaluation results.

Next, the processing executed in this control system 300 is explained in reference to drawings. Through the processing executed in the control system 300, a new model expression generated in correspondence to the plasma processing apparatus 100A, for instance, may be utilized in conjunction with the plasma processing apparatus 100B to generate a new model expression for the plasma processing apparatus 100B, as in the first embodiment.

Figure 4:
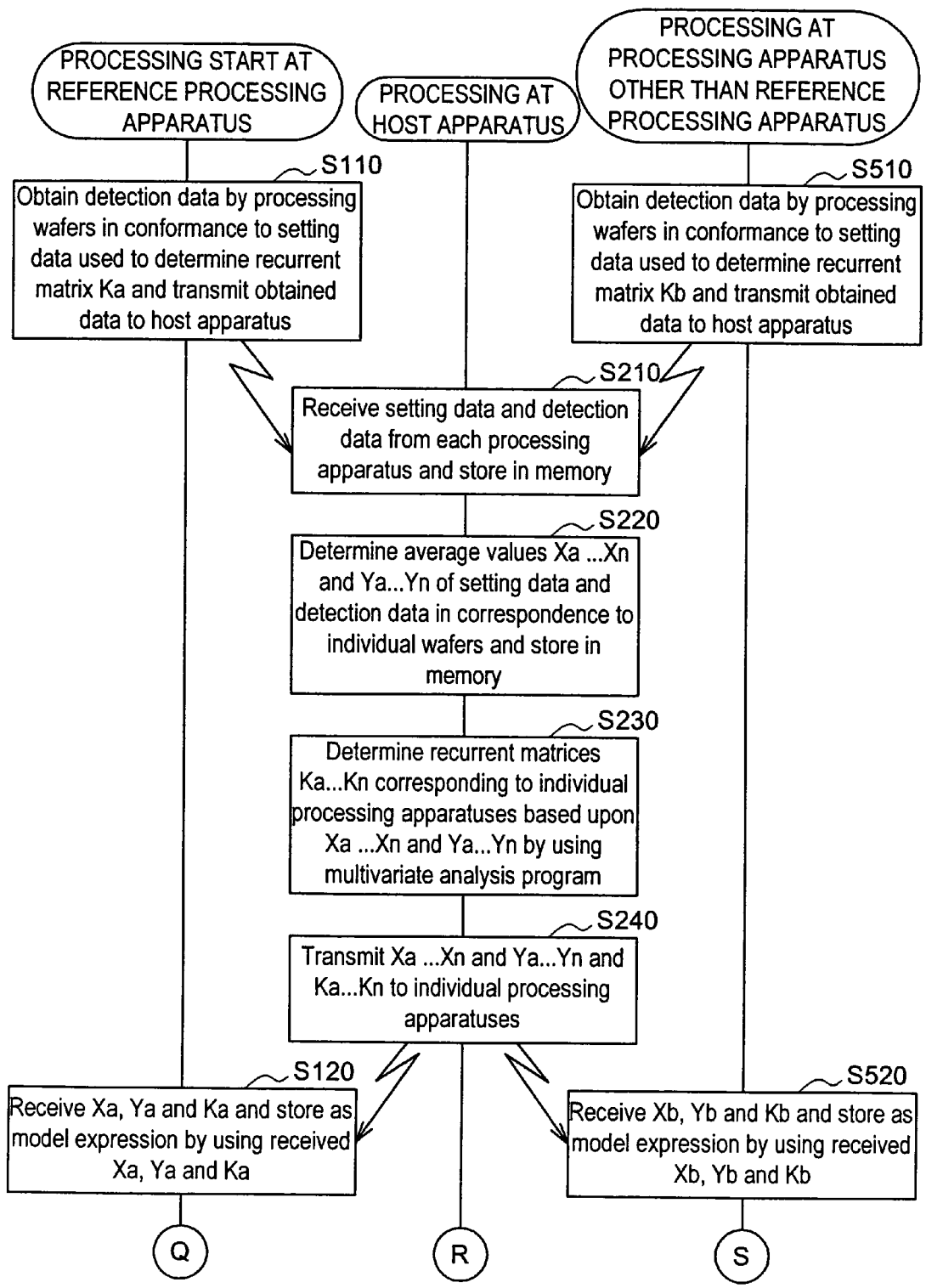
FIG. 4 presents a flowchart of the operation executed to generate model expressions in the processing apparatus control system in the embodiment.
Figure 5:
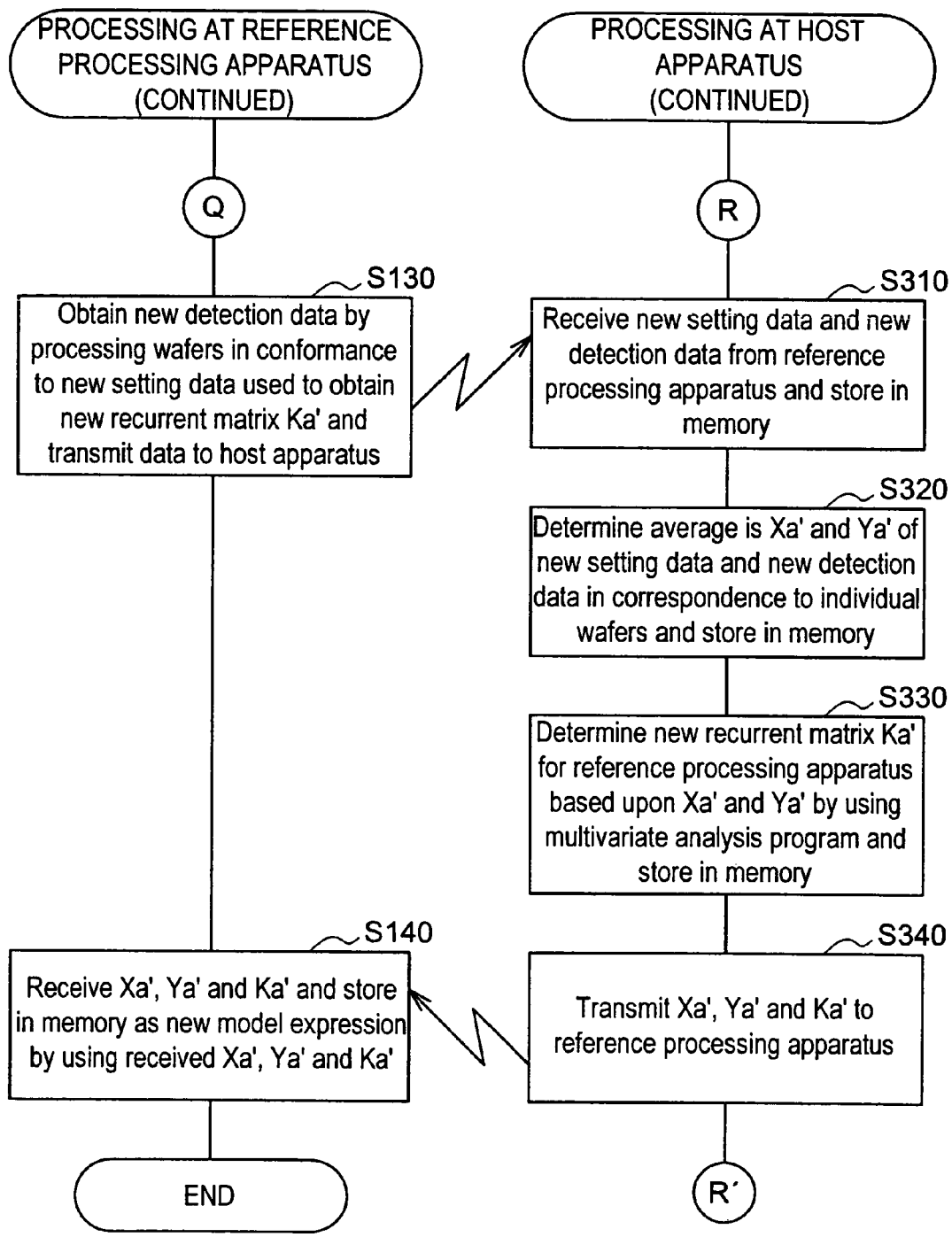
FIG. 5 presents a flowchart of the operation executed to generate model expressions in the processing apparatus control system in the embodiment, in continuation from FIG. 4.
Figure 6:
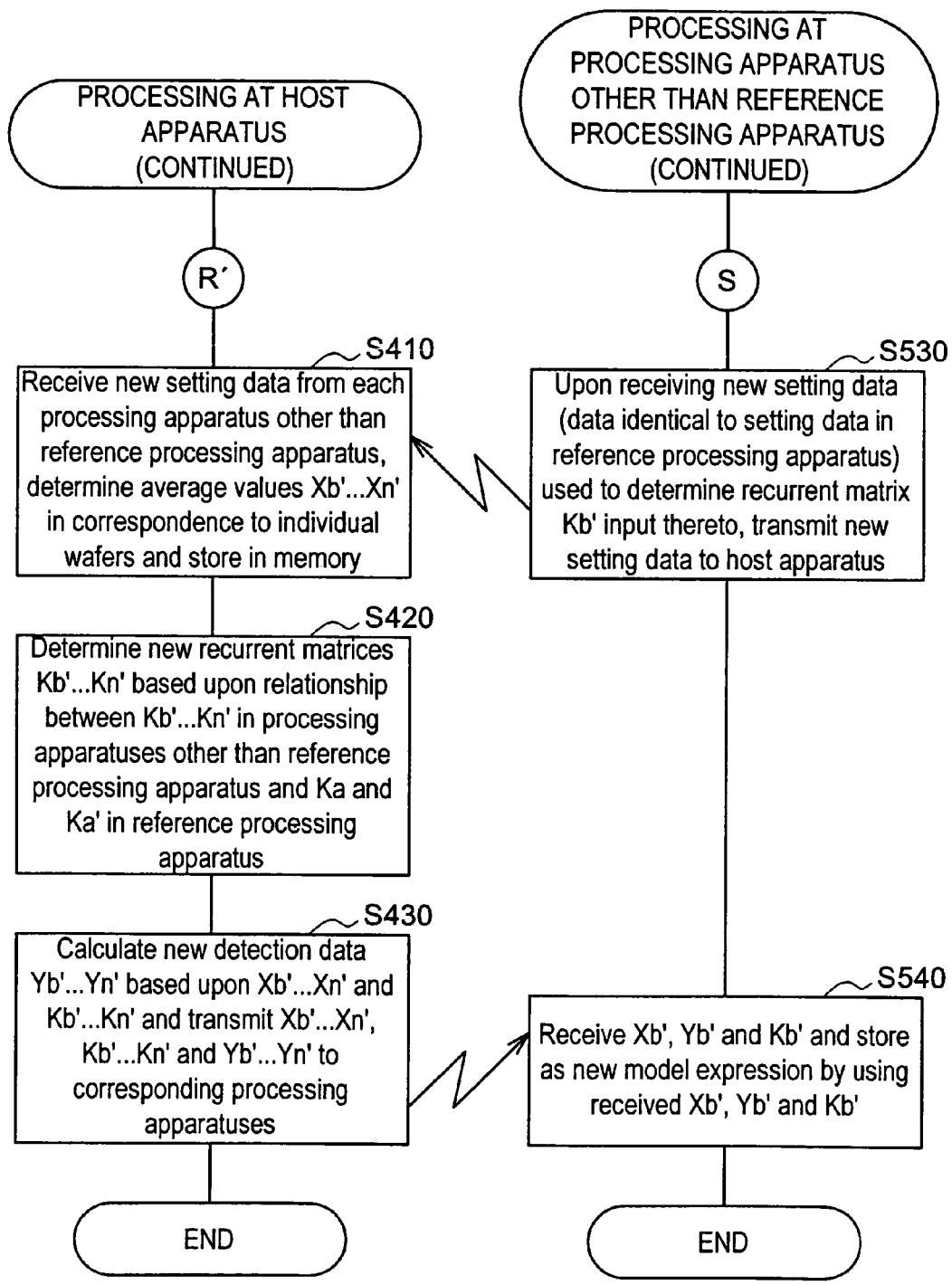
FIG. 6 presents a flowchart of the operation executed to generate model expressions in the processing apparatus control system in the embodiment, in continuation from FIG. 5.

FIGS. 4 through 6 show the operational flow of the processing executed to generate a new model expression for the plasma processing apparatus 100B. More specifically, FIGS. 4 through 6 show the operational flows of the processing executed in the host apparatus, the plasma processing apparatus 100A designated as the reference processing apparatus and the processing apparatuses 100B, . . . , 100N other than the reference processing apparatus. It is to be noted that the processing executed in the plasma processing apparatus 100B is shown in FIGS. 4 through 6 as an example of the processing in the processing apparatuses other than the reference processing apparatus. New model expressions are generated for the other plasma processing apparatuses 100C, . . . , and 100N through an operation identical to that executed in the plasma processing apparatus 100B.

First, as shown in FIG. 4, recurrent matrices Ka, . . . , Kn corresponding to the individual plasma processing apparatuses 100A . . . 100N are determined. This processing is explained in specific terms.

As the setting data (e.g., the control parameters) to be used to determine the recurrent matrix Ka are input through the input section 152A and are set, the plasma processing apparatus 100A designated as the reference processing apparatus processes wafers W based upon these setting data to obtain detection data (e.g., the plasma state parameters) and transmits these setting data and detection data to the host apparatus 310 via the network 320 in step S110.

As the setting data (e.g., the control parameters) to be used to determine the recurrent matrix Kb are input through the input section 152B and are set, a processing apparatus other than the reference processing apparatus, e.g., the plasma processing apparatus 100B, processes wafers W based upon these setting data to obtain detection data (e.g., the plasma state parameters) and transmits these setting data and detection data to the host apparatus 310 via the network 320 in step S510.

The host apparatus 310 receives the setting data and the detection data from the individual plasma processing apparatuses 100A . . . 100N and stores them into the analysis data storage section 316 in step S210. Next, in step S220, the arithmetic operation section 312 in the host apparatus 310 calculates the average values of the received setting data in correspondence to each wafer, the average values are stored into the analysis data storage section 316 as objective variables Xa, . . . , Xn. In addition, the average values of the received detection data are calculated by the arithmetic operation section 312 in correspondence to the individual wafers and the average values thus calculated are stored into the analysis data storage section 316 as explanatory variables Ya, . . . , Yn.

Next, in step S230, the host apparatus 310 engages the arithmetic operation section 312 to determine recurrent matrices Ka, . . . , Kn corresponding to the individual plasma processing apparatuses 100A . . . 100N by using the setting data (objective variables) Xa, . . . , Xn and the detection data (explanatory variables) Ya, . . . , Yn, as in the first embodiment based upon the program adopting the PLS method read from the multivariate analysis program storage section 314 and the recurrent matrices thus calculated are then stored into the analysis data storage section 316. Then, in step S240, the setting data Xa, . . . , Xn, detection data Ya, . . . , Yn and the recurrent matrices Ka, . . . , Kn are transmitted to the individual respective plasma processing apparatuses 100A . . . 100N via the network 320.

Upon receiving the setting data Xa, the detection data Ya and the recurrent matrix Ka from the host apparatus 310, the plasma processing apparatus 100A designated as the reference processing apparatus stores them as the model expression indicated in (1) in step S120. Each of the processing apparatuses other than the reference processing apparatus, e.g., the plasma processing apparatus 100B, receives the setting data Xb, the detection data Yb and the recurrent matrix Kb from the host apparatus 310 and stores them as the model expression indicated in (2) in step S520.

Next, a new model expression is generated in correspondence to the plasma processing apparatus 100A designated as the reference processing apparatus, as shown in FIG. 5. The specific details of the processing are provided below.

As new setting data (e.g., the control parameters) to be used to determine the recurrent matrix Ka' are input and set through the input section 152A, the plasma processing apparatus 100A obtains new detection data (e.g., the plasma state parameters) by processing wafers W based upon the new setting data and transmits the new setting data and the new detection data to the host apparatus 310 via the network 320 in step S130.

In step S310, the host apparatus 310 receives the new setting data and the new detection data provided by the plasma processing apparatus 100A designated as the reference processing apparatus and stores the received data into the analysis data storage section 316. Next, in step S320, the arithmetic operation section 312 in the host apparatus 310 calculates the average values of the received new setting data in correspondence to the individual wafers and stores them as explanatory variables Xa', . . . , Xn' into the analysis data storage section 316 and the arithmetic operation section 312 also calculates the average values of the received new detection data in correspondence to the individual wafers and stores them as objective variables Ya', . . . , Yn' into the analysis data storage section 316.

Next, in step S330, the host apparatus 310 engages the arithmetic operation section 312 to determine recurrent matrix Ka' corresponding to the plasma processing apparatus 100A by using the new setting data (objective variables) Xa' and the new detection data (explanatory variables) Ya', as in the first embodiment based upon the program adopting the PLS method read from the multivariate analysis program storage section 314 and the recurrent matrices thus calculated is then stored into the analysis data storage section 316. Then, in step S340, the new setting data Xa', the new detection data Ya' and the new recurrent matrix Ka' are transmitted to the plasma processing apparatus 100A via the network 320.

The plasma processing apparatus 100A designated as the reference processing apparatus receives the setting data Xa', the detection data Ya' and the recurrent matrix Ka' from the host apparatus 310 and stores them as a new model expression in step S140.

Next, the model expression for a processing apparatus other than the reference processing apparatus, e.g., the plasma processing apparatus 100B, is determined as shown in FIG. 6. Since the new model expression for each of the processing apparatuses other than the reference processing apparatus can be determined based upon the new model expression determined for the reference processing apparatus, no plasma processing needs to be executed on wafers for the purpose of model expression generation in a processing apparatus that is not the reference processing apparatus. The specific details of the processing are explained below.

As setting data used to determine the recurrent matrix Kb' (setting data identical to the setting data used to determine the recurrent matrix Ka) are input through the input section 152B, the plasma processing apparatus 100B transmits these setting data to the host apparatus 310 via the network 320 in step S530.

In step S410, the host apparatus 310 receives the new setting data from the plasma processing apparatus 100B which is not the reference processing apparatus, stores the received setting data into the analysis data storage section 316, calculates the average values of the new setting data having been received in correspondence to the individual wafers by engaging the arithmetic operation section 312 and stores the average values thus calculated as setting data (explanatory variables) Xb', . . . , Xn' into the analysis data storage section 316.

In step S420, the host apparatus 310 engages the arithmetic operation section 312 in operation to individually calculate the new recurrent matrices (Kb' . . . Kn') based upon the proportional relationship of the new recurrent matrices (Kb' . . . Kn') to the recurrent matrices (Kb . . . Kn) corresponding to the processing apparatuses other than the reference processing apparatus and of the new recurrent matrix (Ka') of the reference processing apparatus relative to the recurrent matrix (Ka) having been determined for the reference processing apparatus. For instance, the new recurrent matrix Kb' indicated in (7) for the plasma processing apparatus 100B is calculated as Kb'=Ka'Kb/Ka. Thus, the new recurrent matrix for any processing apparatus that is not the reference processing apparatus can be determined with ease without having to execute any further multivariate analysis processing through the PLS procedure or the like.

Then, in step S430, the host apparatus 310 calculates new detection data (Yb', . . . , Yn') by using the new setting data (Xb', . . . , Xn') and the new recurrent matrices (Kb' . . . Kn') based upon the respective model expressions (7), stores the new detection data into the analysis data storage section 316, and transmits the new setting data (Xb', . . . , Xn') the new recurrent matrices (Kb' . . . Kn') and the new detection data (Yb', . . . , Yn') to the corresponding plasma processing apparatuses 100B, . . . , 100N via the network 320.

The plasma processing apparatus 100B, for instance, receives the new setting data (Xb', . . . , Xn'), the new recurrent matrix (Kb' . . . Kn') and the new detection data (Yb', . . . , Yn') from the host apparatus 310 and stores them as the new model expression (8) in step S540. Thus, new model expressions matching the specific processing apparatuses are generated in the individual processing apparatuses other than the reference apparatus.

Figure 7:
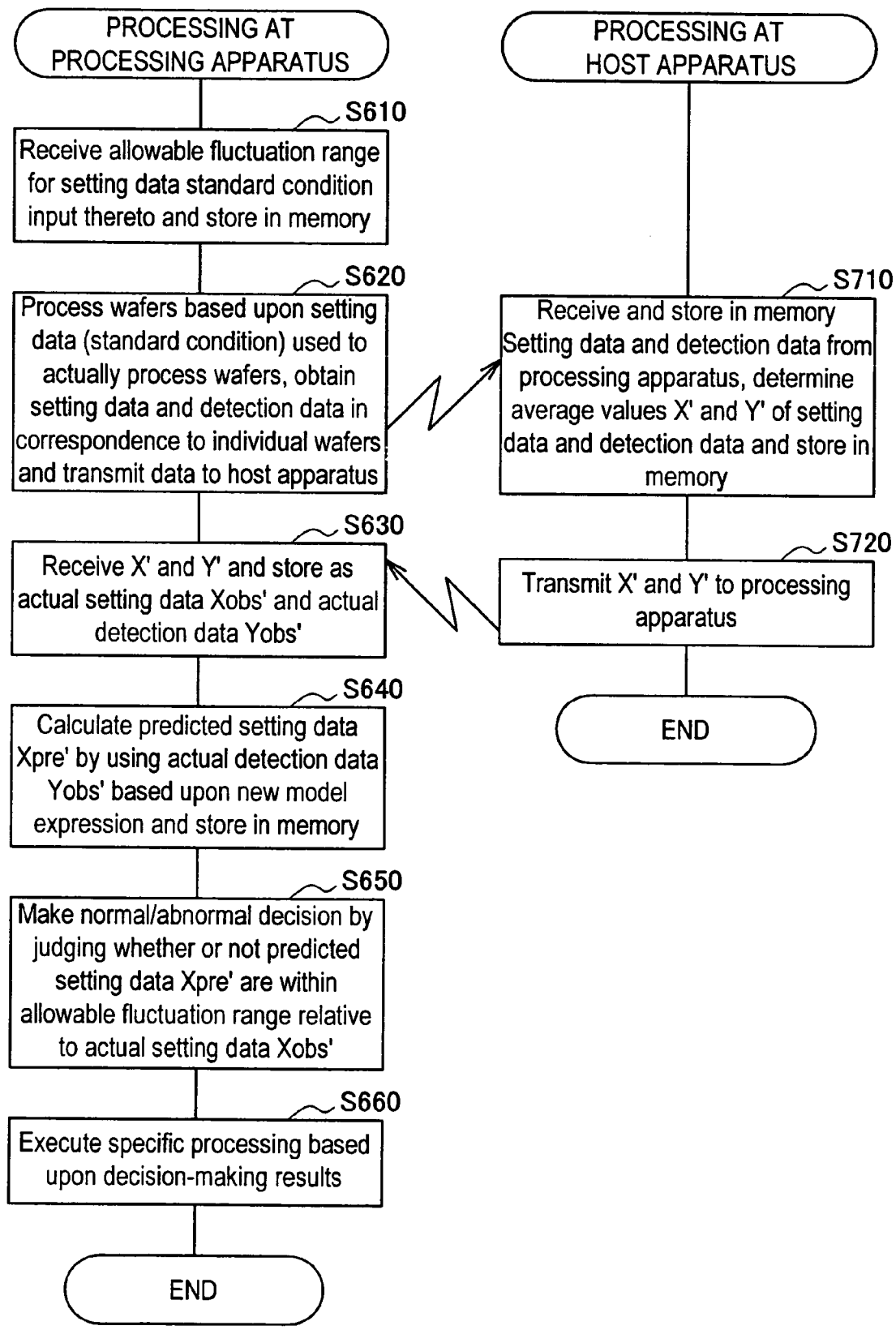
FIG. 7 presents a flowchart of the control implemented by using the model expressions in the processing apparatus control system in the embodiment.

Next, processing executed in the control system to evaluate the apparatus states of the individual apparatuses based upon the new model expressions thus obtained is explained in reference to drawings. FIG. 7 shows the flow of the operation executed in the host apparatus when evaluating the apparatus states based upon the new model expressions individually generated for the various plasma processing apparatuses and the flow of the operation executed in each of the plasma processing apparatuses.

First, as allowable fluctuation ranges relative to the standard conditions with regard to the setting data are input in a given plasma processing apparatus 100, these allowable fluctuation ranges are stored in memory in step S610. Each of these allowable fluctuation ranges is defined by threshold values used to judge whether the apparatus is in a normal state or in an abnormal state and ranges between the maximum value and the minimum value relative to the standard value of a given control parameter constituting the setting data, which is varied in order to generate the new model expression.

Next, as setting data based upon which wafers are to be actually processed (standard conditions, e.g., the standard values indicated in Table 1) are input through the input section 152, the plasma processing apparatus 100 processes wafers W with plasma based upon these setting data obtains the setting data and the detection data measured for each of the wafers W and transmits the setting data and the detection data to the host apparatus 310 via the network 320 in step S620.

The host apparatus 310 receives the setting data and the detection data from the plasma processing apparatus 100 in correspondence to the individual wafers and stores them into the analysis data storage section 316 in step S710. The host apparatus 310 then calculates the average values of the various types of data and stores them as setting data (objective variables) X' and detection data (explanatory variables) Y' into the analysis data storage section 316. Then, in step S720, the host apparatus 310 transmits the setting data X' and the detection data Y' to the plasma processing apparatus 100.

In step S630, the plasma processing apparatus 100 receives the setting data X' and the detection data Y' and stores them as actual setting data Xobs' and actual detection data Yobs' into the analysis data storage section 205. Then, in step S640, the actual detection data Yobs' are used for substitution in the new model expression in (8), thereby calculating predicted setting data Xpre', and the predicted setting data thus calculated are stored into the analysis data storage section 205.

Subsequently, in step S650, the plasma processing apparatus 100 makes a decision as to whether or not the apparatus state is normal by judging whether or not the predicted setting data Xpre' are within the allowable fluctuation ranges relative to the actual setting data Xobs'. It determines that the apparatus state is normal as long as the predicted setting data Xpre' are within the allowable fluctuation ranges relative to the actual setting data Xobs', whereas the apparatus state is determined to be abnormal if the predicted setting data are outside the allowable fluctuation ranges. If it is decided that the apparatus state is abnormal, the processing apparatus control section 225 stops the plasma processing apparatus 100 and a warning is issued through the display section 224 and the warning device 226 in step S660.

As explained above, the host apparatus 310 calculates the average values and executes the multivariate analysis processing based upon the data provided by the individual plasma processing apparatuses, thereby greatly reducing the onus of calculation processing that needs to be executed in each plasma processing apparatus. In addition, since the large volumes of setting data and detection data generated during the plasma processing do not need to be stored in the plasma processing apparatuses even temporarily and the multivariate analysis program does not need to be stored in the plasma processing apparatuses, the plasma processing apparatuses do not need to be equipped with storage section for those purposes. As a result, the structure of the individual plasma processing apparatuses can be simplified and a reduction in the production costs is achieved.

While the state of a given apparatus is judged based upon the new model expression at the plasma processing apparatus in the example explained in reference to the second embodiment, the present invention is not limited to this example, and since the new model expressions are all stored in the host apparatus 310 as well, the states of the individual plasma processing apparatuses 100A, . . . , 100N may be judged by the host apparatus 310. In such a case, if the state of a given plasma processing apparatus is judged to be abnormal, error information may be transmitted to the corresponding plasma processing apparatus 100A, . . . , 100N. Upon receiving the error information, the plasma processing apparatus 100A, . . . , 100N may engage the processing apparatus control section 225 to stop the operation of the processing apparatus and issue an error warning through the display section 224 and the warning device 226. This structure enables centralized monitoring of the apparatus states of the various plasma processing apparatuses by the host apparatus 310.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, setting data measured by the control parameter measuring instrument 221 while processing wafers with plasma, such as those used when judging the state of a specific processing apparatus based upon the new model expression in the second embodiment, may be used as the setting data in the first and second embodiments, or the setting data input through the input section 152 may be directly utilized. While the setting data measured via the control parameter measuring instrument 221 can be used as long as all the setting data can be measured with the control parameter measuring instrument 221, it is more effective to directly utilize the input setting data if some of the setting data cannot be measured via the control parameter measuring instrument 221.

In addition, no apparatus state parameters are used in the multivariate analysis executed in the embodiments described above, apparatus state parameters may be used as objective variables or as explanatory variables. The high-frequency power, the flow rates of the individual gases constituting the process gas, the distance between the electrodes and the chamber internal pressure are used as the control parameters constituting the objective variables used to generate model expressions in the embodiments explained above, parameters other than these may be used as long as they are controllable parameters.

While the capacities of the variable capacitors, the high-frequency voltage and the degree of openness of the APC are used as the apparatus state parameters in the examples explained above, parameters other than these may be used as long as they are measurable parameters that indicate the apparatus state. Furthermore, while the electrical data and the optical data attributable to the plasma are used as the plasma state parameters that indicate the state of the plasma, parameters other than these may be used as long as they are parameters that reflect the plasma state. While the high-frequency voltages and the high-frequency currents corresponding to the fundamental wave and higher harmonic waves (up to the quadruple wave) constitute the electrical data, different types of electrical data may be used, instead.

Moreover, data output from measurement section built into the plasma processing apparatus, which measures the wafer finish (e.g., scatterometry), may be used as the detection data. More specifically, the detection data may be constituted with characteristics values indicating the film thickness of the film formed on the wafer, the extent to which the processing target film on the wafer is etched, the in-plane uniformity and the like. In addition, while the average values of the various types of data constituting the plasma state parameters are calculated for each wafer and the control parameters and the apparatus state parameters are predicted for the wafer based upon these average values, the control parameters and the apparatus state parameters may be predicted in real-time by using real-time plasma state parameters detected while processing a given wafer.

While the present invention is adopted in plane parallel plasma processing apparatuses with magnetic fields in the embodiments explained above, the present invention may be adopted in any apparatus with control parameters, plasma state parameters and/or apparatus state parameters.

As described in detail above, according to the present invention, once a model expression is generated for a given processing apparatus, the model expression can be utilized in conjunction with other processing apparatuses of the same type even when the processing characteristics or the processing conditions of the individual processing apparatuses are not completely uniform. Thus, a method for generating a multivariate analysis model expression for processing apparatuses and a method for executing a multivariate analysis on processing apparatuses, through which the onus of the model expression generation can be reduced by eliminating the need for generating a new model expression from scratch for each processing apparatus, are provided.

The present invention may be adopted in a method for generating multivariate analysis model expressions for processing apparatuses such as plasma processing apparatuses, a method for executing a multivariate analysis on processing apparatuses, a control device of a processing apparatus and a control system for processing apparatuses.

What is claimed is:

1. A method for generating a multivariate analysis model expression for a processing apparatus, the method comprising:

a first step in which a recurrent matrix of detection data provided by a plurality of sensors in a processing apparatus operating with first setting data is ascertained through multivariate analysis for each processing apparatus among a plurality of processing apparatuses that operate based upon the first setting data, the plurality of processing apparatuses including a processing apparatus designated as a reference processing apparatus and a first processing apparatus that is not the reference processing apparatus;

a second step in which a recurrent matrix of detection data provided by the plurality of sensors in the reference processing apparatus is ascertained through multivariate analysis when the reference processing apparatus operates based upon new second setting data with the second setting data;

a third step in which a recurrent matrix of detection data with the second setting data in the first processing apparatus is ascertained based upon the recurrent matrix determined through the first step for the first processing apparatus, the recurrent matrix determined through the first step for the reference processing apparatus and the recurrent matrix determined through the second step for the reference processing apparatus, wherein the third step does not use detection data obtained from the first processing apparatus operating with the second setting data;

a fourth step in which a multivariate analysis model expression to be used to evaluate an apparatus state of the first processing apparatus or to predict processing results in the first processing apparatus is generated based upon the recurrent matrix ascertained through the third step; and a fifth step of storing the multivariate analysis model expression in a computer-readable storage medium.

2. A method for generating a multivariate analysis model expression for a processing apparatus according to claim 1, wherein:

in the third step, the third recurrent matrix between the second setting data and the detection data in the first processing apparatus is determined based upon a proportional relationship between the recurrent matrix of the detection data with the second setting data in the first processing apparatus relative to the recurrent matrix ascertained through the first step for the first processing apparatus and the recurrent matrix ascertained through the second step for the reference processing apparatus relative to the recurrent matrix ascertained through the first step for the reference processing apparatus.

3. A method for generating a multivariate analysis model expression for a processing apparatus according to claim 1, wherein:

the multivariate analysis is executed by adopting a method of partial least squares.

4. A method for generating a multivariate analysis model expression for a processing apparatus according to claim 1, wherein:

the processing apparatuses are plasma processing apparatuses.

5. A method for generating a multivariate analysis model expression for a processing apparatus according to claim 1, wherein:

the processing apparatuses are plasma processing apparatuses; and the setting data are constituted with a plurality of control parameters with which the state of the plasma can be controlled and the detection data are constituted with at least one parameter or two or more parameters selected from a group of parameters including a plurality of plasma state parameters indicating the plasma state, a plurality of apparatus state parameters related to the apparatus state and parameters that reflect the processing results.

6. A method for generating a multivariate analysis model expression for a processing apparatus according to claim 1, wherein:

the processing apparatuses are plasma processing apparatuses; and the setting data are constituted with a plurality of control parameters with which the state of the plasma can be controlled and the detection data are constituted with at least one parameter or two or more parameters selected from a group of parameters including a plurality of plasma state parameters indicating the plasma state, a plurality of apparatus state parameters related to the apparatus state and parameters that reflect the processing results; and the multivariate analysis model expression is a correlational expression indicating a correlation of detection data calculated based upon the recurrent matrix determined through the third step for the first processing apparatus with the second setting data.

7. A control device of a processing apparatus, included in the processing apparatus which processes a workpiece to control the processing apparatus based upon specific setting data, comprising:

a transmission/reception section capable of data exchange through a connection with a network with which the processing apparatus and a host apparatus at least are connected, wherein:

the control device transmits the first setting data and detection data provided by a plurality of sensors in the processing apparatus operating based upon the first setting data to the host apparatus via the network by engaging the transmission/reception section in operation, receives a recurrent matrix between the first setting data and the detection data ascertained by the host apparatus through a multivariate analysis from the host apparatus via the network by engaging the transmission/reception section in operation;

the control device transmits new second setting data to the host apparatus via the network by engaging the transmission/reception section and receives a recurrent matrix between the second setting data and detection data corresponding to the second setting data, which is ascertained through multivariate analysis by the host apparatus based upon the transmitted data via the network by engaging the transmission/reception section in operation; and the control device generates a multivariate analysis model expression based upon the recurrent matrix with regard to the second setting data received from the host apparatus, evaluates the apparatus state of the processing apparatus or predicts the processing results to be achieved in the processing apparatus based upon the multivariate analysis model expression and controls the processing apparatus based upon the results of the evaluation or the prediction;

wherein the recurrent matrix with regard to the second setting data in the processing apparatus is calculated by the host apparatus based upon the recurrent matrix with regard to the first setting data in the processing apparatus determined by the host apparatus through multivariate analysis, a recurrent matrix of detection data provided by a plurality of sensors in a reference processing apparatus operating based upon the first setting data with the first setting data, which is determined by the host apparatus through multivariate analysis, and a recurrent matrix of detection data provided by the plurality of sensors in the reference processing apparatus operating based upon the second setting data with the second setting data, which is determined by the host apparatus through multivariate analysis, wherein calculating the recurrent matrix with regard to the second setting data in the processing apparatus does not use detection data obtained from the processing apparatus operating with the second setting data.

8. A control device of a processing apparatus according to claim 7, wherein:

the multivariate analysis is executed by adopting a method of partial least squares.

9. A control device of a processing apparatus according to claim 7, wherein:

the processing apparatus is a plasma processing apparatus.

10. A control device of a processing apparatus according to claim 7, wherein:

the processing apparatus is a plasma processing apparatus; and the setting data are constituted with a plurality of control parameters with which the state of the plasma can be controlled and the detection data is constituted with at least one parameter or two or more parameters selected from a group of parameters including a plurality of plasma state parameters indicating the plasma state, a plurality of apparatus state parameters related to the apparatus state and parameters that reflect the processing results.

11. A control system for processing apparatuses that process workpieces, each having a control device that controls the processing apparatus based upon specific setting data, comprising:

a plurality of processing apparatuses each connected to a network via a transmission/reception section; and a host apparatus connected to the network, wherein:

upon receiving first setting data and detection data provided by a plurality of sensors in each processing apparatus among the plurality of processing apparatuses operating based upon the first setting data from the plurality of processing apparatuses via the network, the host apparatus ascertains a recurrent matrix between the first setting data and the detection data through multivariate analysis for each processing apparatus and transmits the recurrent matrix to its corresponding processing apparatus via the network;

upon receiving new second setting data and detection data provided by the plurality of sensors in one of the processing apparatuses designated as a reference processing apparatus operating based upon the second setting data from the reference processing apparatus via the network, the host apparatus ascertains a recurrent matrix between the second setting data and the detection data having been received through multivariate analysis and transmits the recurrent matrix thus ascertained to the reference processing apparatus via the network;

upon receiving the second setting data from an other processing apparatus that is not the reference processing apparatus via the network, the host apparatus ascertains a recurrent matrix between the received second setting data and detection data corresponding to the second setting data based upon the recurrent matrix with regard to the first setting data in the other processing apparatus ascertained through the multivariate analysis, the recurrent matrix with regard to the first setting data in the reference processing apparatus ascertained through the multivariate analysis and the recurrent matrix with regard to the second setting data in the reference processing apparatus having been ascertained through the multivariate analysis and transmits the recurrent matrix thus ascertained to the other processing apparatus via the network, wherein ascertaining the recurrent matrix between the received second setting data and detection data corresponding to the second setting data based upon the recurrent matrix with regard to the first setting data in the other processing apparatus does not use the detection data obtained from the other processing apparatus operating with the second setting data; and wherein the other processing apparatus generates a multivariate analysis model expression based upon the recurrent matrix with regard to the second setting data received from the host apparatus, the apparatus state of the processing apparatus is evaluated or the processing results to be achieved in the processing apparatus are predicted based upon the multivariate analysis model expression, and the processing apparatus is controlled based upon the evaluation results or the prediction results.

12. A control system for processing apparatuses according to claim 11, wherein:

the multivariate analysis is executed by adopting a method of partial least squares.

13. A control system for processing apparatuses according to claim 11, wherein:

the processing apparatuses are plasma processing apparatuses.

14. A control system for processing apparatuses according to claim 11, wherein:

the processing apparatuses are plasma processing apparatuses; and the setting data are constituted with a plurality of control parameters with which the state of the plasma can be controlled and the detection data may be constituted with at least one parameter or two or more parameters selected from a group of parameters including a plurality of plasma state parameters indicating the plasma state, a plurality of apparatus state parameters related to the apparatus state and parameters that reflect the processing results.

* * * * *

UNITED STATES PATENT AND TRADEMARK OFFICE
CERTIFICATE OF CORRECTION

PATENT NO. : 7,505,879 B2  Page 1 of 1
APPLICATION NO. : 11/003829
DATED : March 17, 2009
INVENTOR(S) : Masayuki Tomoyasu et al.

It is certified that error appears in the above-identified patent and that said Letters Patent is hereby corrected as shown below:

On the title page, item (57), line 17, "four" should read --for--.

Signed and Sealed this

Twelfth Day of May, 2009

JOHN DOLL
*Acting Director of the United States Patent and Trademark Office*